(12) United States Patent
Pisharodi

(10) Patent No.: US 9,287,428 B2
(45) Date of Patent: Mar. 15, 2016

(54) PHOTOVOLTAIC SYSTEMS WITH INTERMITTENT AND CONTINUOUS RECYCLING OF LIGHT

(71) Applicant: Perumala Corporation, Brownsville, TX (US)

(72) Inventor: Madhavan Pisharodi, Brownsville, TX (US)

(73) Assignee: Perumala Corporation, Brownsville, TX (US)

( * ) Notice: Subject to any disclaimer, the term of this patent is extended or adjusted under 35 U.S.C. 154(b) by 0 days.

(21) Appl. No.: 14/506,232

(22) Filed: Oct. 3, 2014

(65) Prior Publication Data

US 2015/0325734 A1   Nov. 12, 2015

Related U.S. Application Data

(63) Continuation-in-part of application No. 29/490,051, filed on May 6, 2014, now abandoned.

(60) Provisional application No. 62/003,790, filed on May 28, 2014, provisional application No. 62/039,704, filed on Aug. 20, 2014.

(51) Int. Cl.
| | | |
|---|---|---|
| *H01L 31/042* | (2014.01) | |
| *H01L 31/043* | (2014.01) | |
| *H01L 31/054* | (2014.01) | |
| *H01L 31/0352* | (2006.01) | |

(52) U.S. Cl.
CPC ...... *H01L 31/043* (2014.12); *H01L 31/035281* (2013.01); *H01L 31/042* (2013.01); *H01L 31/0547* (2014.12); *Y02E 10/52* (2013.01)

(58) Field of Classification Search
CPC ............ H02S 40/22; H01L 31/035281; H01L 31/043; H01L 31/0352; H01L 31/00; H01L 31/047; H01L 31/042; H01L 31/0547
USPC .................................................. 136/244, 246
See application file for complete search history.

(56) References Cited

U.S. PATENT DOCUMENTS

| | | | |
|---|---|---|---|
| 4,200,472 A * | 4/1980 | Chappell et al. .............. | 136/246 |
| 6,369,316 B1 * | 4/2002 | Plessing et al. ............... | 136/251 |
| 6,515,217 B1 * | 2/2003 | Aylaian ......................... | 136/246 |
| 6,586,668 B2 | 7/2003 | Shugar | |

(Continued)

FOREIGN PATENT DOCUMENTS

FR    2961023 A1 *  12/2011

OTHER PUBLICATIONS

Written opinion and search report dated Aug. 21, 2015 for co-pending PCT patent application No. PCT/US15/32615.

*Primary Examiner* — Allison Bourke
(74) *Attorney, Agent, or Firm* — D'Ambrosio & Menon, PLLC; Usha Menon

(57) ABSTRACT

The one or more embodiments of the present invention propose a novel photovoltaic system. The system can include a housing and at least one layer of photovoltaic panels inside the housing. Photovoltaic cells can be arranged on the panel. Light is reflected in many ways and recycled within the housing either continuously or intermittently. This can reduce the loss of light energy back into the atmosphere due to reflections from the panel and can also improve the working efficiency of the photovoltaic cells by creating multiple passes for the light either continuously or intermittently.

20 Claims, 28 Drawing Sheets

(56) References Cited

U.S. PATENT DOCUMENTS

| | | | |
|---|---|---|---|
| 6,689,949 B2 * | 2/2004 | Ortabasi | 136/246 |
| 7,380,549 B1 | 6/2008 | Ratliff | |
| 8,266,847 B2 * | 9/2012 | Edgar | F24J 2/523 136/244 |
| 2004/0211458 A1 * | 10/2004 | Gui | H01G 9/2031 136/244 |
| 2006/0180197 A1 * | 8/2006 | Gui | H01G 9/2031 136/255 |
| 2008/0308151 A1 * | 12/2008 | Den Boer | H01L 31/02168 136/256 |
| 2010/0078056 A1 * | 4/2010 | Hovel | H01L 31/042 136/244 |
| 2010/0242517 A1 | 9/2010 | Johnson | |
| 2010/0326493 A1 | 12/2010 | Sherman | |
| 2011/0030766 A1 * | 2/2011 | Son et al. | 136/248 |
| 2011/0253200 A1 * | 10/2011 | Shtein | H01L 31/042 136/251 |
| 2012/0055536 A1 | 3/2012 | Saito | |
| 2012/0167492 A1 | 7/2012 | Cummings | |
| 2013/0112241 A1 * | 5/2013 | Gerritsen | H02S 40/22 136/246 |
| 2014/0069486 A1 * | 3/2014 | Snidow | 136/251 |

* cited by examiner

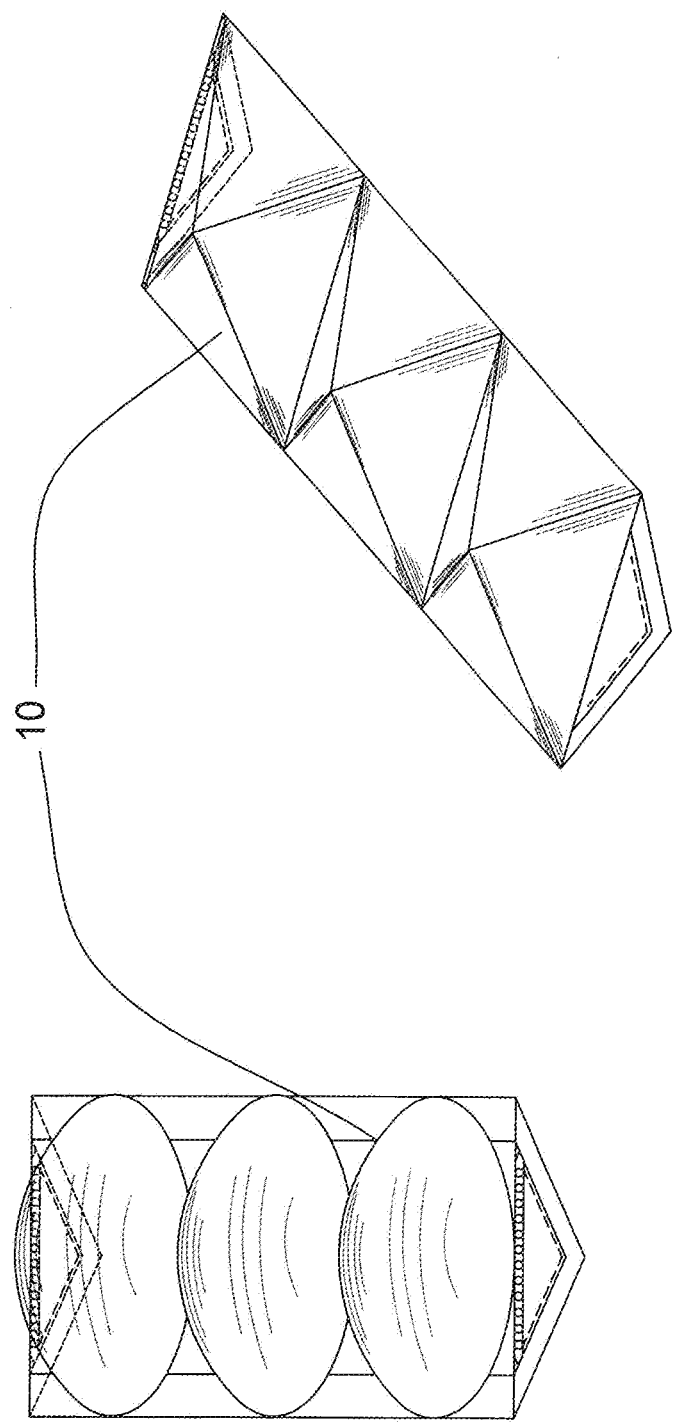

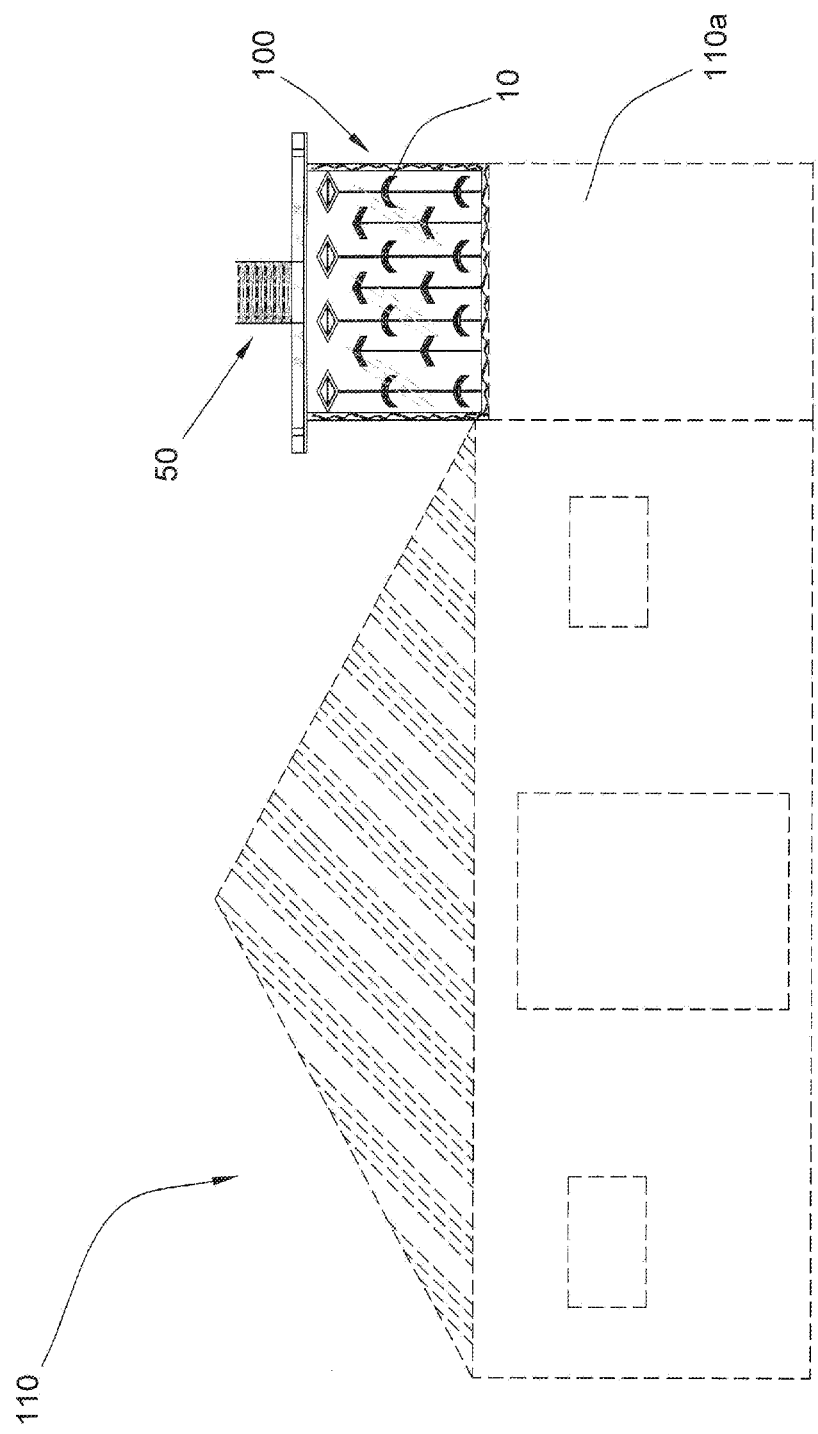

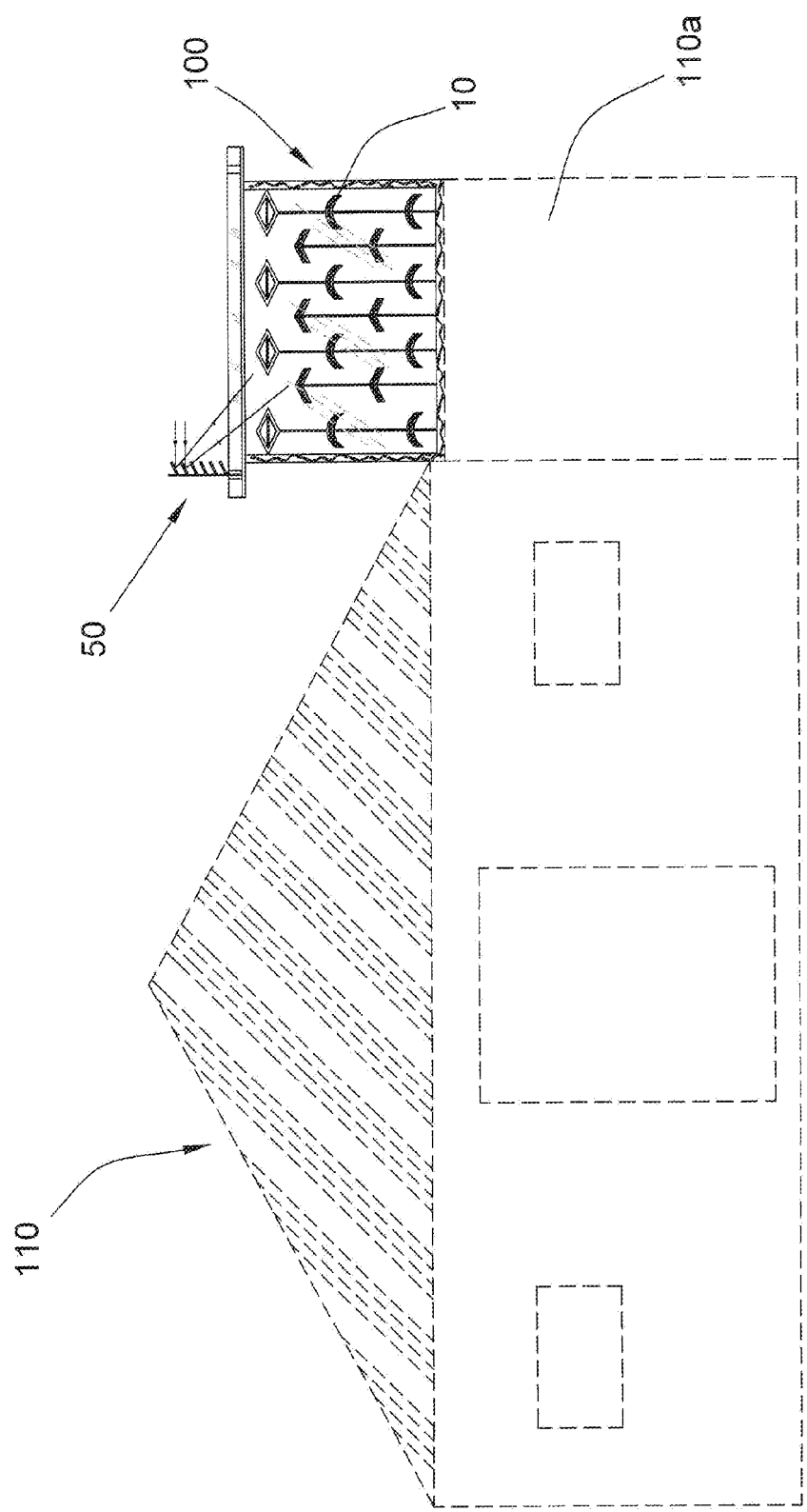

PHOTOVOLTAIC SYSTEMS WITH INTERMITTENT AND CONTINUOUS RECYCLING OF LIGHT

RELATED APPLICATIONS

This application claims the benefit of priority to U.S. Provisional Application No. 62/003,790 filed on May 28, 2014 and to U.S. Provisional Application No. 62/039,704 filed on Aug. 20, 2014, and this application is a continuation-in-part of U.S. application Ser. No. 29/490,051 filed on May 6, 2014 the contents of all of which have been incorporated by reference in their entireties herein.

FIELD OF INVENTION

The present invention relates generally to the field of photovoltaic systems for conversion of solar energy into electrical energy using a method of recycling of light intermittently or continuously.

BACKGROUND

Use of renewable energies is increasing because of the limited supply of coal, petroleum products and other hydrocarbons. Renewable energy sources are green and environmentally friendly. Among the renewable energies, solar energy is freely and abundantly available.

Various commonly used devices are operable with solar energy. For example, solar calculators are very common. In addition to solar energy, these calculators work under any source of light energy. Similarly wrist watches are also available that work under light energy of any kind. Solar and other light energies are useful for several applications, from powering space stations to many household appliances.

Photovoltaic systems use solar radiation—both direct and scattered sunlight—to create electrical energy. The basic building blocks of a photovoltaic system are solar/photovoltaic cells. The cells typically consist of semiconductor materials that convert light into electricity. In order to increase power output, a plurality of cells can be interconnected to form panels or modules. The panels are typically flat. Several modules can be installed in a rack to form a photovoltaic array. Photovoltaic systems further include mounting racks and hardware for the panels, wiring for electrical connections, and power conditioning equipment, including inverters and optional batteries for electricity storage.

The energy conversion efficiency or ECE ($\eta$) of the cells is the percentage of the incident photon energy in the form of sunlight or any other source of light that is converted to electrical energy. When a photon penetrates a photovoltaic cell, it can produce an electron-hole pair. The pair generated may contribute to the current produced by the cell or may recombine with no net contribution to cell current.

SUMMARY

The one or more embodiments of the present invention propose a novel photovoltaic system. The system can include a housing and at least one panel layer inside the housing. Semi-conductors/solar cells can be arranged on the panel. Light is recycled within the housing either continuously or intermittently. This will reduce the loss from the reflections outside the housing and will also improve the working efficiency of the semi-conductors/solar cells by creating the multiple passes, continuously or intermittently.

BRIEF DESCRIPTION OF THE DRAWINGS

The features and advantages of certain embodiments will be more readily appreciated when considered in conjunction with the accompanying figures. The figures are not to be construed as limiting any of the preferred embodiments.

FIG. 24 illustrates a top panel made of smaller hemispherical units according to an embodiment of the invention.

FIG. 25 illustrates a top panel made of smaller pyramidal units according to an embodiment of the invention.

FIG. 26 illustrates a PV system with a frontal view of a mirror assembly installed as part of a building to meet its electrical needs according to an embodiment of the invention.

FIG. 27 illustrates a PV system with a side view of a mirror assembly installed as part of a building to meet its electrical needs according to an embodiment of the invention.

DETAILED DESCRIPTION OF THE INVENTION

Figure 1:
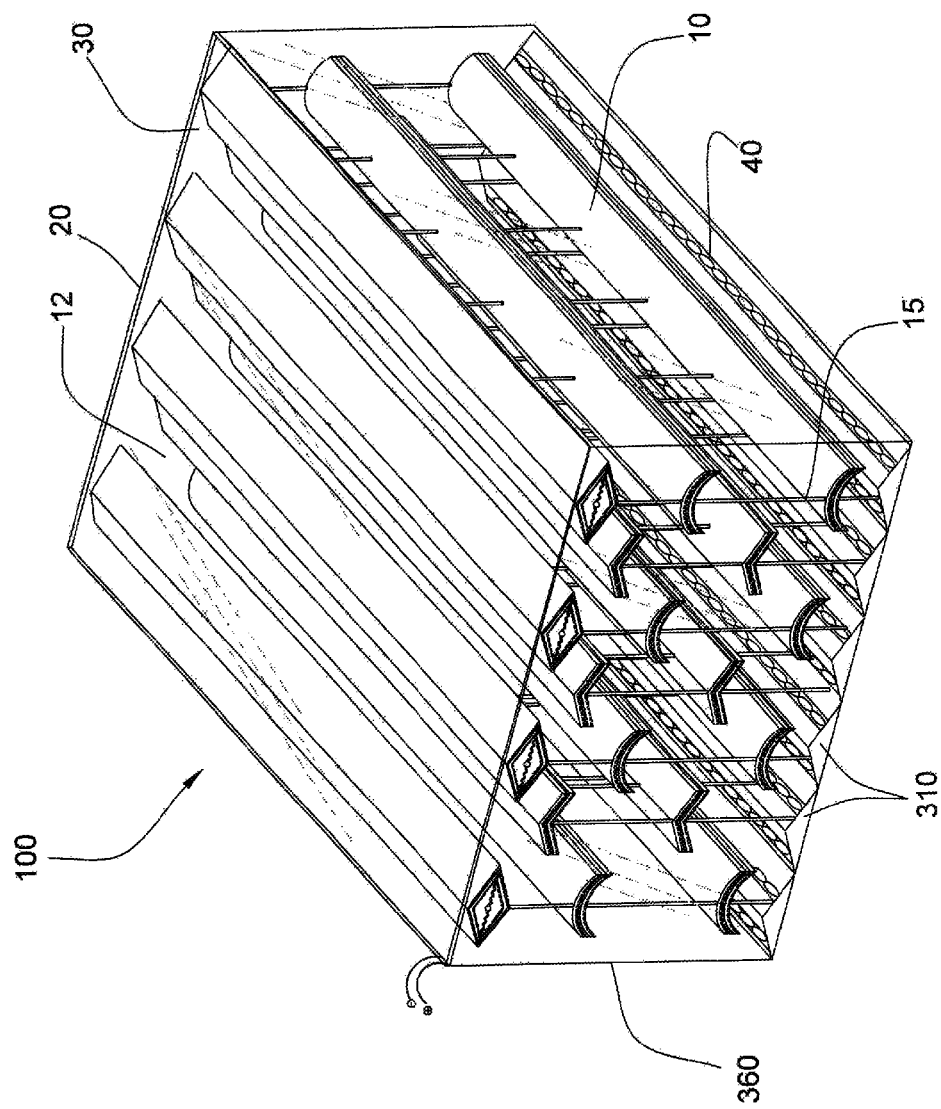
FIG. 1 illustrates a perspective view of a photovoltaic (PV) system according to an embodiment of the invention wherein the housing accommodates diamond shaped elongated panels, inverted V-Shaped panels and archway panels all covered with a specialized cover.

The following description presents several preferred embodiments of the present invention in sufficient detail such that those skilled in the art can make and use the invention.

As used herein, the words "comprise," "have," "include," and all grammatical variations thereof are each intended to have an open, non-limiting meaning that does not exclude additional elements or steps. As used herein, a "fluid" can be a liquid or gas. For example, the fluid may be water, air, or gas.

Our ability to harvest solar energy continues to be inefficient. The amount of power generated by a photovoltaic (PV) system can depend on: (a) the amount of the sunlight that reaches the system, and (b) how the available light is utilized. Most solar panels cannot capture and utilize optimal light for various reasons. For solar applications, this limitation reduces the utility of the PV system significantly especially in non-tropical regions of the world. The area required for the PV system to generate even modest amount of energy is very large and this limits its utility. Furthermore, conventional present solar panels are continuously bombarded by the solar radiation. It is further hypothesized that the solar cells may function sub-optimally when it they are constantly stimulated without intervening rest periods.

In a typical solar panel there is about ⅓ of the total light reflected back into the atmosphere from the outer surface of the panel. The infrared and ultraviolet rays are wasted by producing undesirable heat when the intended use is to produce electricity. Another portion of the light passes through the panel without doing anything. All these wasted elements amount to over 50% of the available light. In addition, there is inherent system inefficiency, due to the single pass of light through the semi-conductor, reducing its total energy conversion rate to about 17 to 18% efficiency. Yet another serious problem with the present solar panels may be the factor of continuous stimulation paralyzing the solar cells and reducing its efficiency. The benefit of intermittent stimulation is an area not studied so far and has the potential to make significant contribution to the harvesting of solar energy.

Considerable research and development has been devoted to improving the various parts of a photovoltaic system to improve generation of electricity. Much of the research has been focused on improvements in solar cells and in improving the energy conversion efficiency of solar cells. Research has also been focused on concentrators in which light is focused by lenses or mirrors onto an array of solar cells. While the demand for solar and photovoltaic technology continues to grow worldwide, widespread use is inhibited by associated costs.

According to one embodiment, a photovoltaic ("PV") system that can recycle light is provided to address the concerns with the prior art PV systems. The PV system can optimize electrical energy output. The PV system can include a plurality of layers (for example, multi-planar rows) of panels. In each layer, the panels can be placed with gaps between them to allow light rays to pass through. Alternately, or in conjunction with the gaps, the panels may also be interconnected with transparent bridge plates or connecting elements. Gaps and/or connecting elements may be found in each successive panel layer. The solar panels or panels in subsequent layers are arranged alternately so that the panels in a second panel layer are directly below the gaps in the first layer and so on to allow the passage of light rays through the gaps. The top panels and/or panels beneath the top layer can be non-flat. It is envisioned that high efficiency cells and other advancements in solar cell technology can be readily incorporated into the PV system according to the one or more embodiments disclosed herein. They can facilitate reflection and include (solar) cells on both sides.

The panels may be placed within a housing or enclosure. The housing may include a specialized top cover plate/sheet. The housing, the specialized top cover plate/sheet for the housing and/or the bridge plates of the top panel layer may be transparent. An ultraviolet (UV) or infrared (IR) filter or coating may be further incorporated into an outer surface of the top of the housing or the bridge plate of the top panel layer. Such a filter or coating may advantageously filter out undesirable UV/IR light bands while allowing optimal bands of light to penetrate into the housing, thereby reducing the generation of heat if the heat is not desirable. The inside lining of the housing may also be made of a material that can reflect solar or other light energy.

Such an arrangement creates a light trap by forcing light to stay within the housing. The PV system can utilize the principle of total internal reflection of light. The PV system can facilitate the recycling of light rays within the housing in multiple planes and multiple directions. Advantageously, the arrangement of the panels with the gaps/transparent connecting elements can cause the trapped light to be potentially reflected multiple times within the PV system which can cause the photons to repeatedly stimulate the cells. This can result in the production of an enhanced amount of electrical energy.

In another embodiment, the PV system can incorporate a cooling apparatus outside or within the housing. Water, air or other suitable fluids can be circulated water within the fluid circulator.

Figure 7:
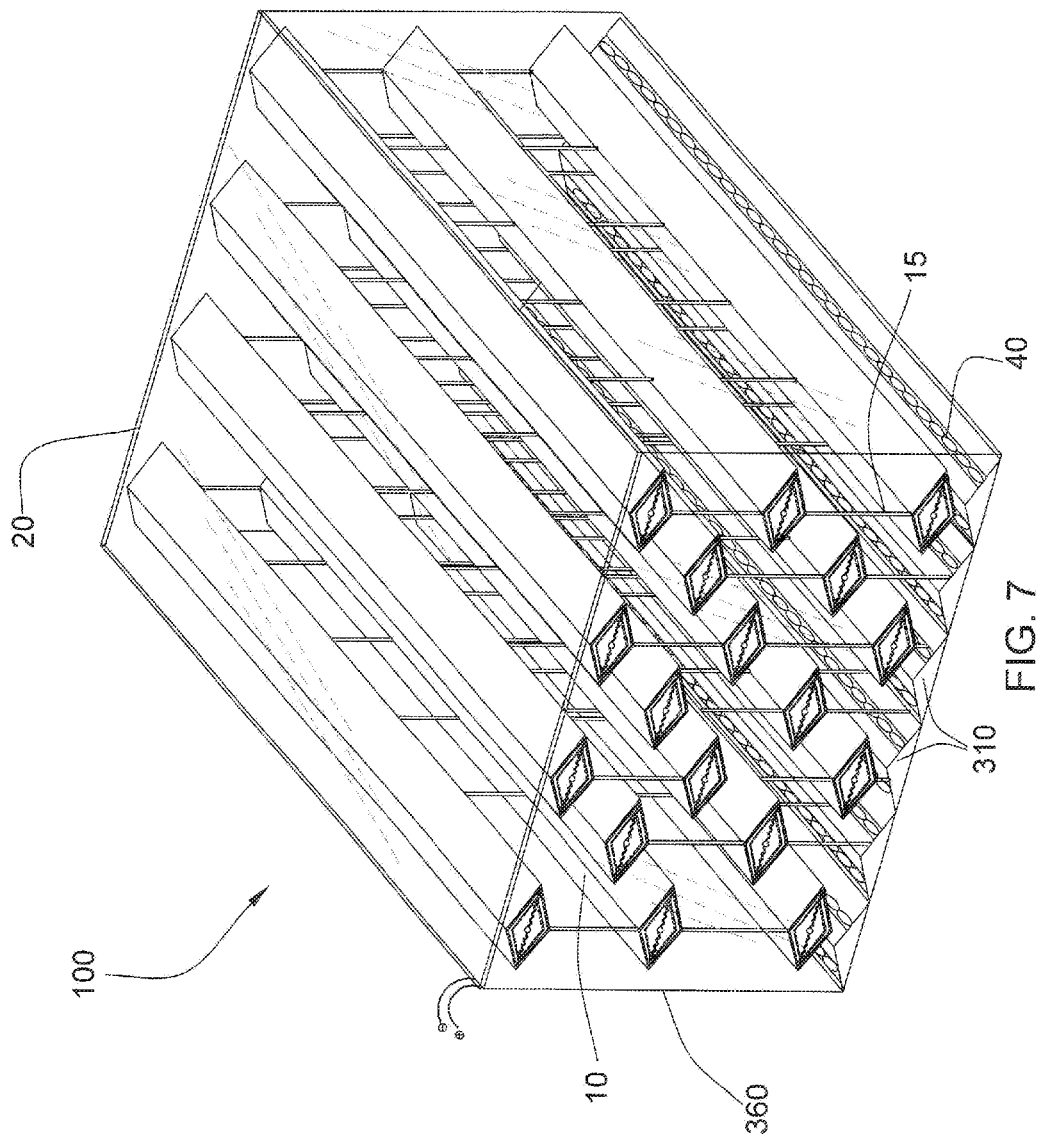
FIG. 7 illustrates another embodiment of the PV system of FIG. 5 with specialized cover and diamond shaped panels without the bridge plates and with posts to hold the panels.

With reference to FIGS. 1 and 7, an exemplary embodiment of a PV system 100 is described. The PV system 100 comprises a housing 30 having at least a transparent top cover plate 20. According to this and other embodiments, the top cover plate 20 may be transparent. In one or more embodiments, one or more sidewalls 360 (aside from the top) of the housing 30 may also be transparent. Several elongated panels 10 can be stacked in the housing 30. The panels 10 may be supported by means of one or more supporting posts 15. The PV system 100 may further include a base panel 310. A plurality of solar/photovoltaic cells ("cells") 40 may be arranged along the top and under the surfaces of the panels 10 (shown in FIG. 3 and FIG. 4) and along an upper surface of the base panel 310. The inside surfaces of sidewalls 360 of the housing, including the one at the bottom, may be provided with reflecting surfaces, to increase the incident photon energy on the panels 10, or maybe lined with additional panels 10 or 310.

The surface of the panels 10 and base panel 310 can be corrugated or wavy. This facilitates the reflection and deflection of light rays that enter the housing 30. The selection of the number of layers of panels 10, and the angles at which the panels 10 may be arranged, can be predetermined to facilitate substantially total internal reflection inside the housing 30.

Instead of layering the panels 10 tightly within the housing 30, the panels 10 within each layer can be arranged at a distance or gap 12 from each other. The gaps 12 can allow the passage of light into the PV system 100 and allow the light to reach secondary and deeper panel layers. Each layer of panels 10 can be spaced apart from a succeeding row of panels. The size of the gaps 12 and the spacing between the layers may be predetermined to facilitate substantially total internal reflection inside the housing 30. As shown in FIG. 7, the housing 30 may be provided with a specialized cover plate/sheet 20 (described later).

Figure 21:
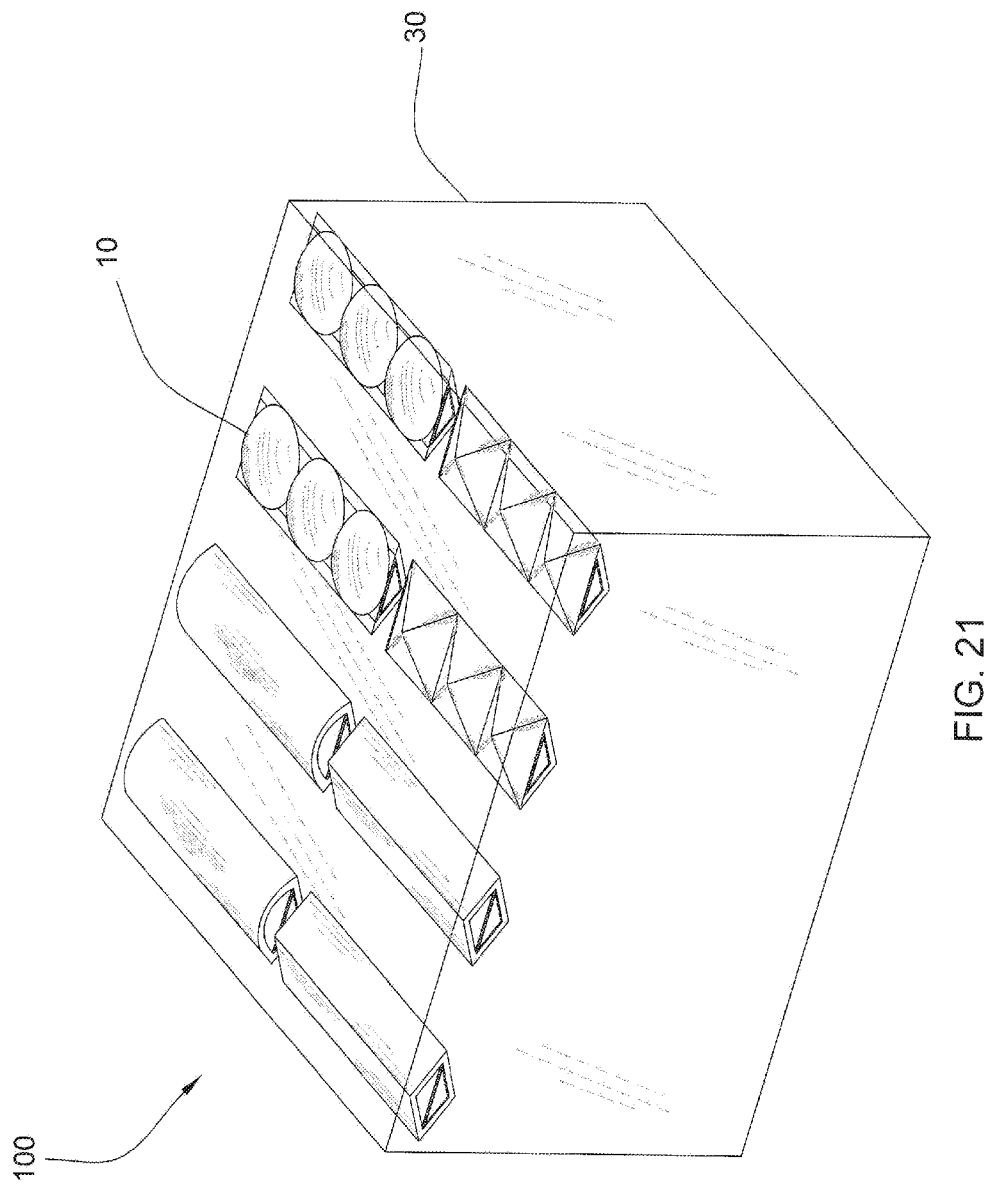
FIG. 21 illustrates a plurality of elongated top panels according to an embodiment of the invention.
Figure 23:
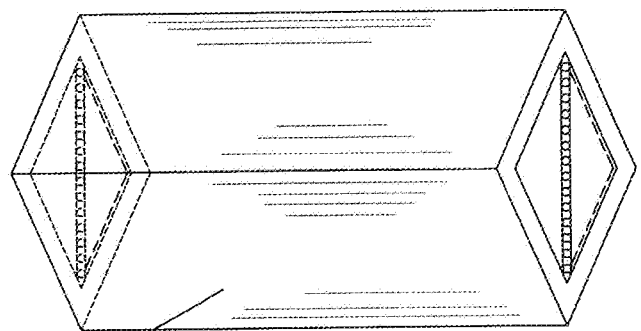
FIG. 23 illustrates a diamond-shaped elongated top panel according to an embodiment of the invention.
Figure 22:
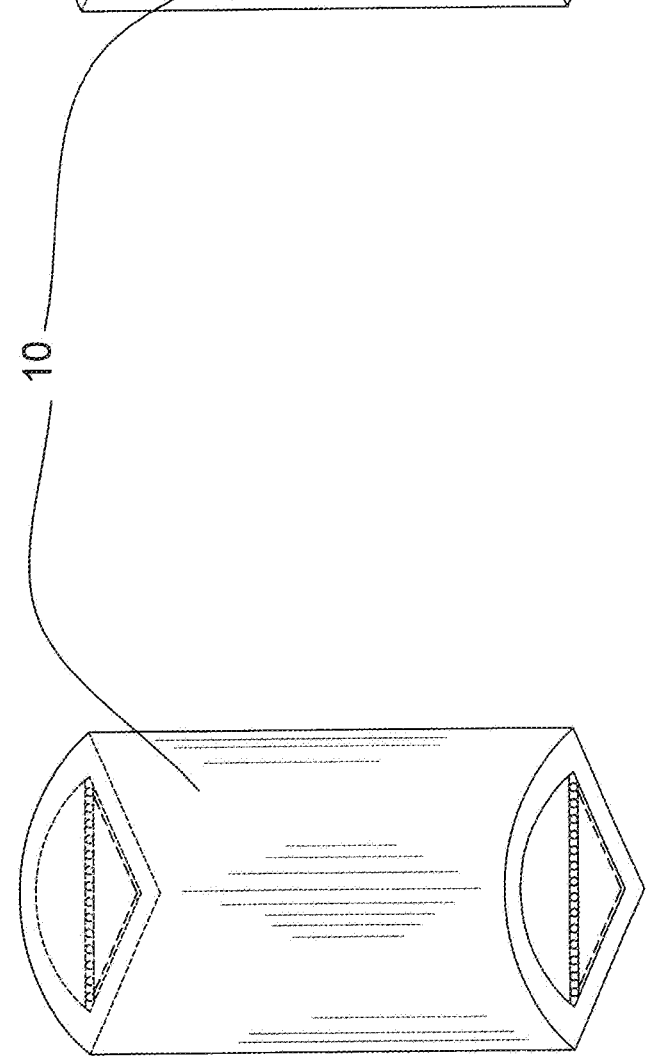
FIG. 22 illustrates an arcuate-shaped elongated top panel according to an embodiment of the invention.

As shown, the panels 10 may not have a flat geometry. As shown in FIG. 1, the panels 10 may have diamond and inverted V-shapes (they can also be inverted-U, ovoid, circular, etc. in cross section). As shown in FIG. 7, the panels 10 may be diamond-shaped. For example, FIG. 21 illustrates an embodiment of the PV system 100 having housing 30. The housing includes a top layer of panels 10 having various shapes, such as, diamond-shaped, oval, and combinations of pyramidal and hemispherical shapes on the top side and V-like shape on the bottom side. The inside panel layers are intentionally not depicted in this figure. FIG. 22 shows an embodiment of the panels 10 with the top side being of hemispherical shape and the bottom side being V-like shaped. FIG. 23 shows an embodiment of the panels 10 having a diamond-shape. FIG. 24 shows an embodiment of the panels 10 with hemispherical units. FIG. 25 shows an embodiment of the panels 10 with the top side being of pyramidal shape and the bottom side being V-like shaped. The purpose of these various shapes is to optimize light absorption even when the sunlight is not hitting straight down and is coming down from different angles. A person skilled in the art can understand that other embodiments with other such variations in panel geometries and their combinations are possible and are within the scope of this disclosure for the intended purpose. It is understood that the various geometries disclosed herein are intended to be non-limiting and the panels 10 can include any suitable non-planar geometry.

Figure 2:
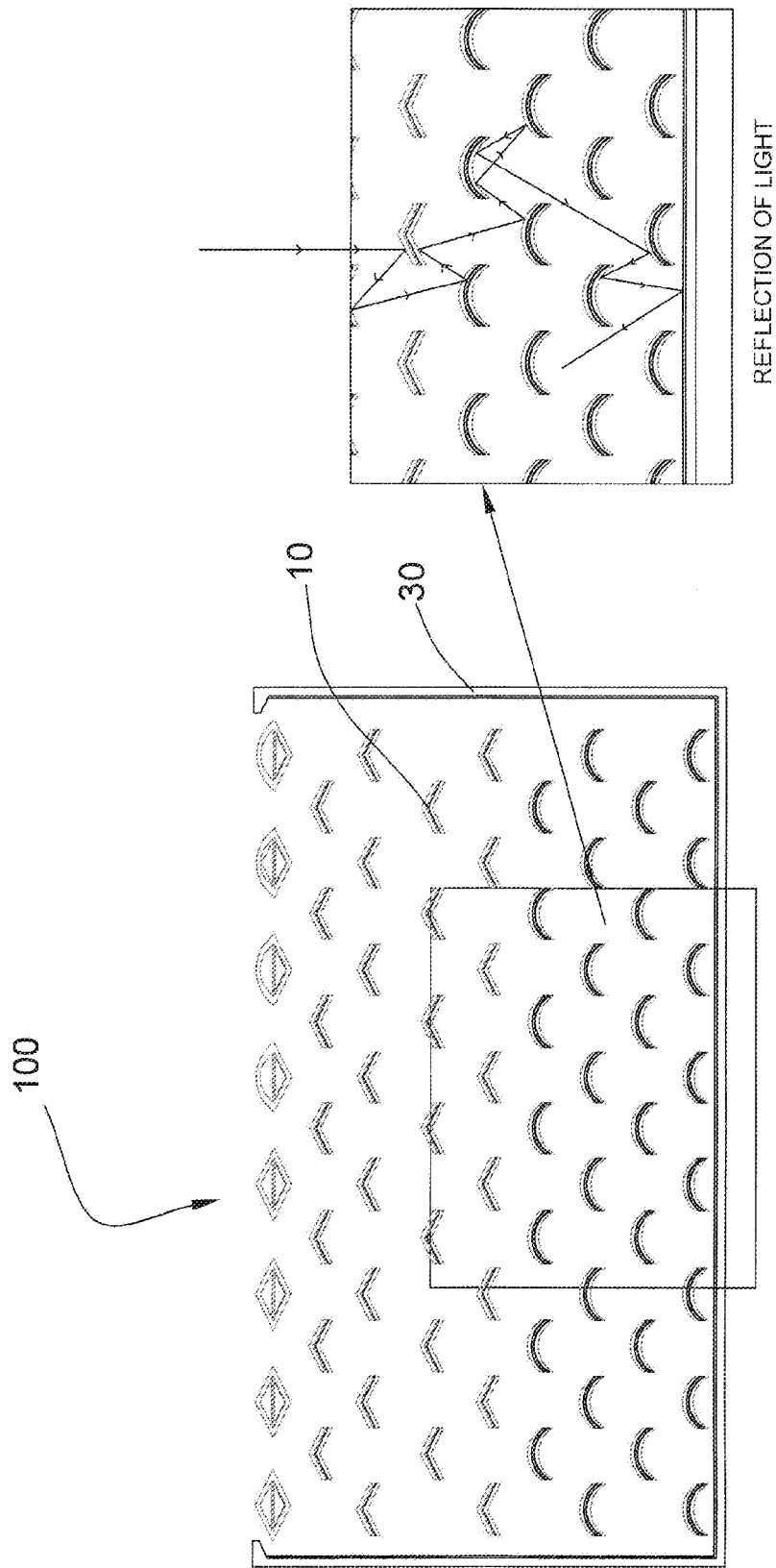
FIG. 2 illustrates a cross-sectional view of the PV system according to an embodiment of the invention, wherein a section of it is expanded to illustrate multiple reflections of the light rays between the panels.

As shown in a cross-sectional figure of the PV system 100 in FIG. 2, the arrangement of multiple panels 10 having non-planar shapes (for example, diamond, inverted V and arcuate) inside the housing 30 can facilitate multiple reflections of the light rays inside the housing 30. Accordingly, the energy conversion efficiency (ECE) of the photon energy to electrical energy in the PV system 100 can be substantially enhanced over comparable prior art systems.

Figure 3:
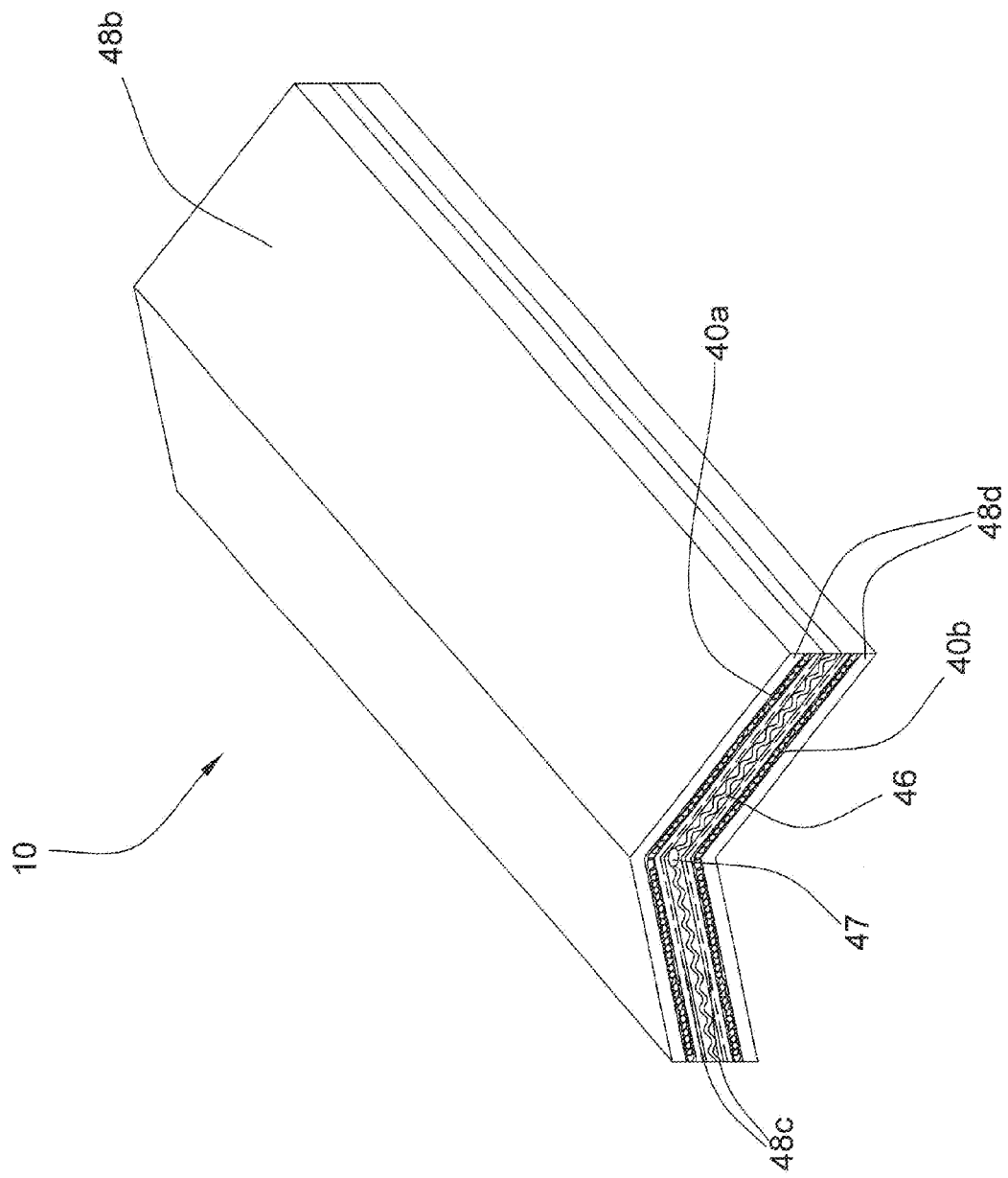
FIG. 3 illustrates a perspective view of a single elongated panel of the PV system with an inverted V-like shape, according to an embodiment of the invention.
Figure 4:
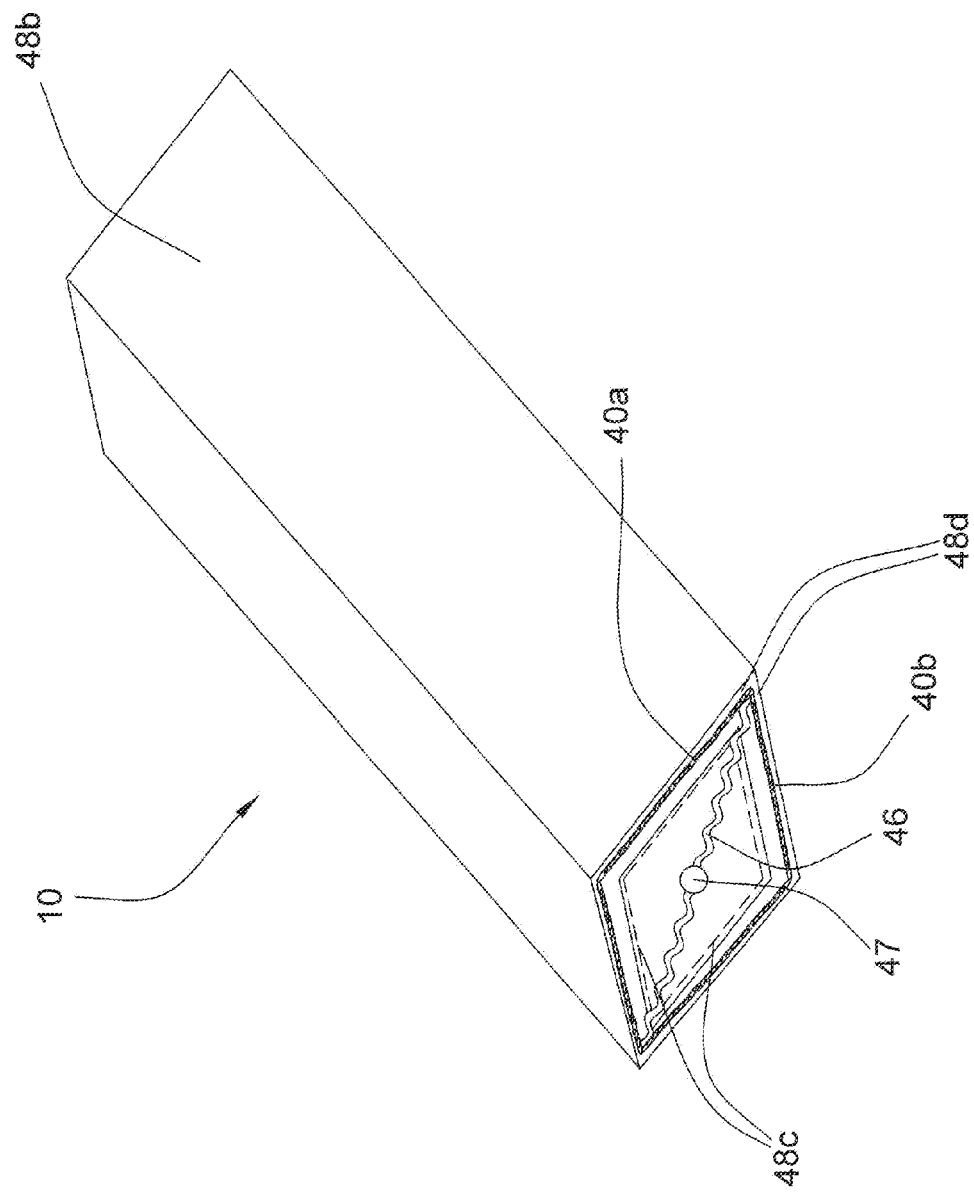
FIG. 4 illustrates a perspective view of a single elongated panel of the PV system with a diamond shape according to an embodiment of the invention.

The arrangement of the cells 40 along non-planar panel 10 is partially illustrated in FIGS. 3 and 4. FIG. 3 illustrates a panel 10 having an inverted V-like shape while FIG. 4 shows another embodiment of the panel 10 which is diamond-shaped in cross section. Now referring to both FIGS. 3 and 4, the cells can be assembled along the inside surface of the panel 10 in two layers, one on the top 40$a$ and the other on the bottom 40$b$ of the panel 10. The upward 40$a$ and downward 40$b$ facing cells can be arranged along reflecting surfaces 48$c$. The cells 40$a$, 40$b$ are protected at the top and bottom by transparent layers 48$d$. The current generated by the cells 40$a$ and 40$b$ can be collected in their respective coils 46 and collectively sourced to external points by an output line 47. Other details for cells are well known in the art and hence not described further herein. The upward facing cells 40$a$ can receive the direct incident photon energy as well as energy that is reflected within the housing (as described earlier). The downward facing cells 40$b$ can also receive energy that is reflected within the housing (as described earlier).

Figure 6:
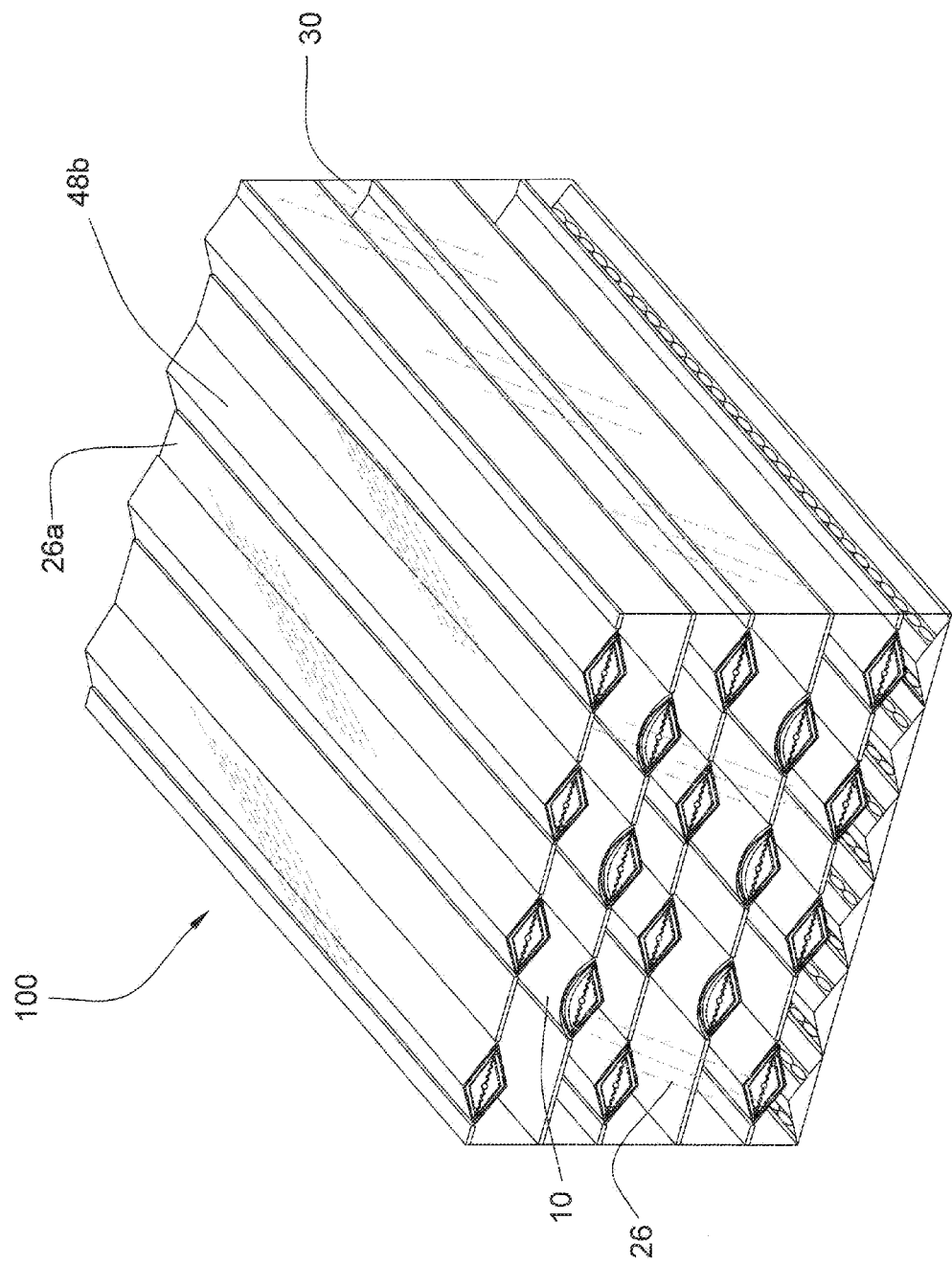
FIG. 6 illustrates another embodiment of the PV system without a cover but having connecting bridge plates for the top layer substituting for the cover, and regular connecting bridge plates for the inside panels.
Figure 8:
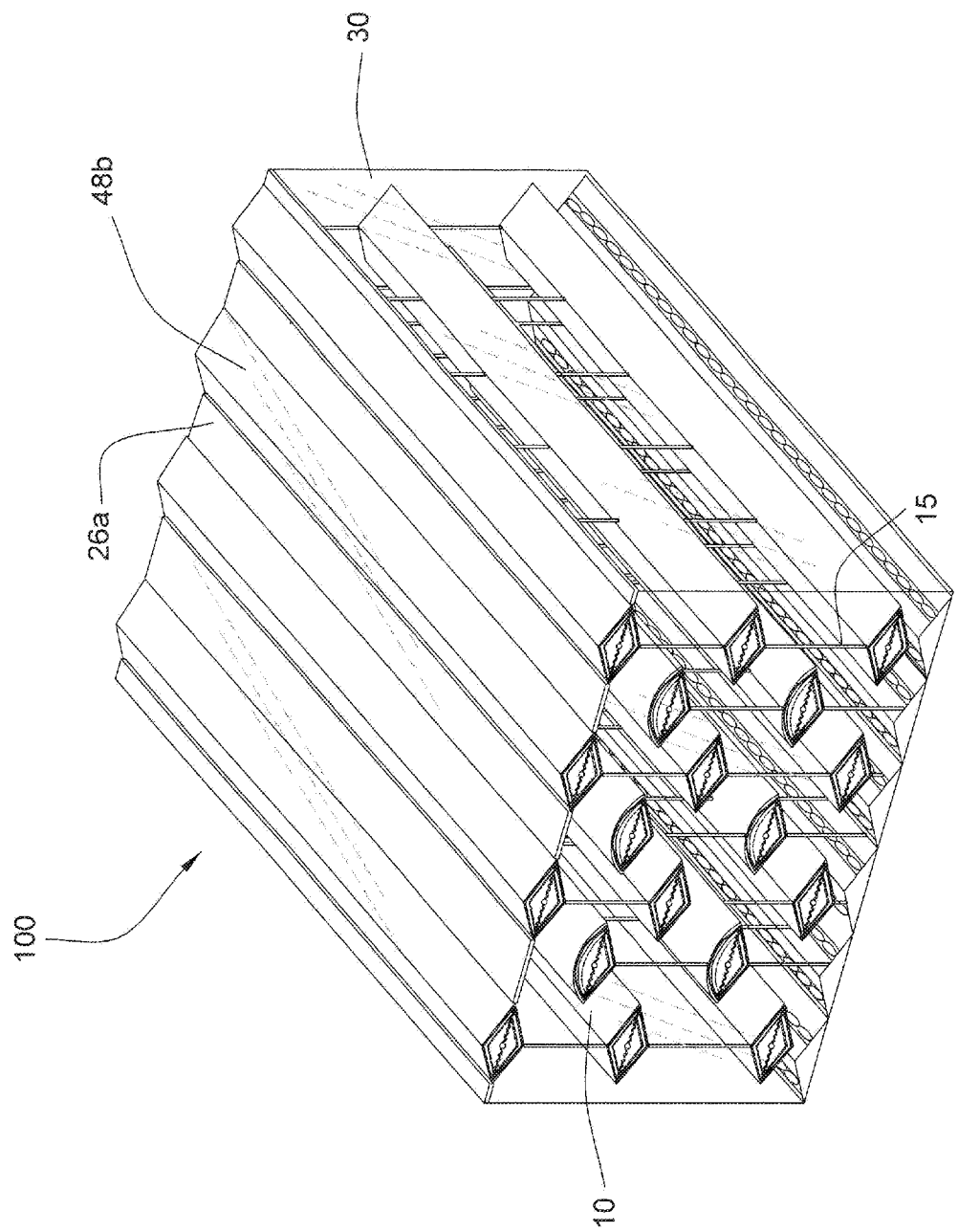
FIG. 8 illustrates another embodiment of the PV system with diamond and oval panels with posts to support the panel and one layer of specialized bridge plates for the top panels.

It may be noted here that the panels 10 may be provided with an anti-reflective coating on the top surface 48$b$ (as shown in FIGS. 6 and 8) in order to reduce the top surface reflection of the top panels.

As shown, for example, in FIG. 1, the multiple rows of panels 10 can facilitate the recycling of light that enter the housing 30 and can minimize the loss of light from the housing 30 into the ambient environment. In order to optimize the net ECE of the PV system 100 by utilizing the recycled light, the architecture within the housing 30 needs to be optimized. Some of the parameters to be optimized are the shapes of the panels 10, number of rows (or layers) of the panels 10, series of panels 10 within a row, the gaps 12 between the panels 10 in a row, the spacing between the rows and the like. The series of panels 10 in successive rows can be positioned so as to cause minimal shadowing effects on the cells 40. The non-planar surface of the panels 10 facilitates the reflection and scattering of light inside the housing 30. Light recycling may be facilitated from the multiple panels 10 and the inside surface of the sidewalls and bottom of the housing 30. When multiple panels 10 are arranged in one layer, each panel 10 may be separated from an adjacent panel 10 in the same layer by an appropriately sized gap. With multiple layers of panels 10, each layer of panels 10 can be separated from an adjacent layer by an appropriately sized spacing. The gaps between the panels 10 can enable photon energy to enter the housing 30 and reach the inside or deeper panels 10. The panels 10 in each succeeding layer are positioned beneath the gaps in a preceding layer. With multiple panels 10 arranged to cover the gaps between the panels 10 just above, reflection of photon energy in multiple panels 10 and in multiple directions can be facilitated.

Figure 5:
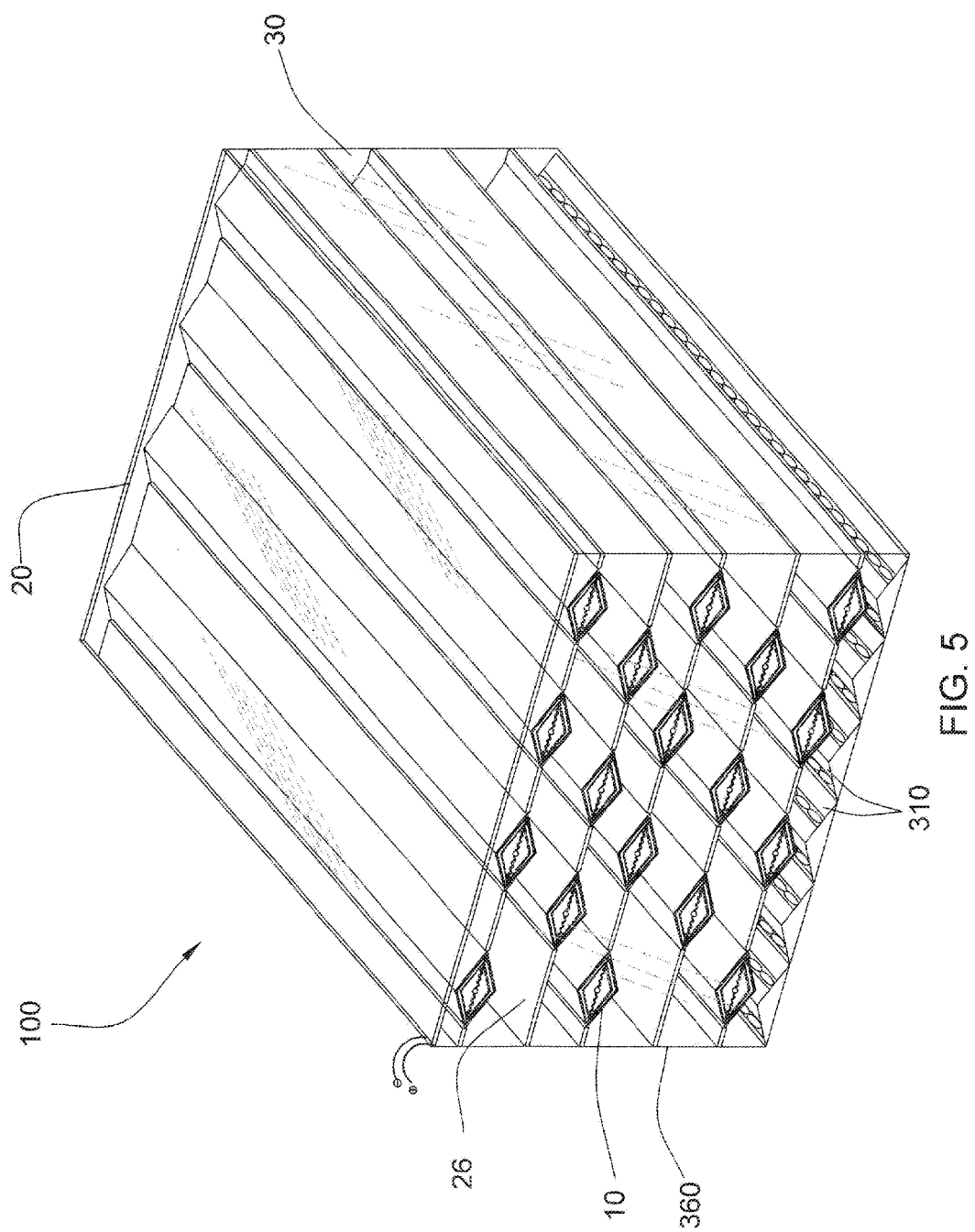
FIG. 5 illustrates another embodiment of the PV system with a specialized cover plate/sheet, bridge plates and base panels.

FIG. 5 illustrates another embodiment of the PV system 100 wherein multiple rows of diamond-shaped panels 10 can be connected and anchored with bridge or connecting plates 26 to the sidewalls 360. All or substantially all the panels 10 of the PV system 100 may be interconnected by one or more transparent bridge 26 to form a layer. The bridge plates 26 can help to secure the panel layers to the walls 360 instead of using the support posts 15 (shown in FIG. 1).

The connecting plates 26 may be transparent material like polycarbonate, glass or the like. The housing 30 can include a top having a specialized cover plate/sheet 20 (described in detail later). The illustrated PV system 100 also includes a base panel 310.

FIGS. 6 and 8 depict perspective views of a PV system 100 having panels 10. As shown, instead of a top specialized cover plate/sheet (as shown in FIG. 5), the topmost row of panels 10 may be interconnected by a plurality of connecting or bridge plates 26$a$. The top bridge plates 26$a$ may be transparent material like polycarbonate, glass or the like. The resulting interconnected top panel can serve as the top cover plate for the housing 30, except that in this case the top bridge plates 26a can have the special features (described below) of the specialized top cover plate/sheet (shown in FIG. 5). The internal bridge plates 26, shown in FIG. 6, may be simple transparent sheets. The embodiment shown in FIG. 8 omits the internal bridge plates. Instead, the panels 10 are supported by posts 15.

Figure 9:
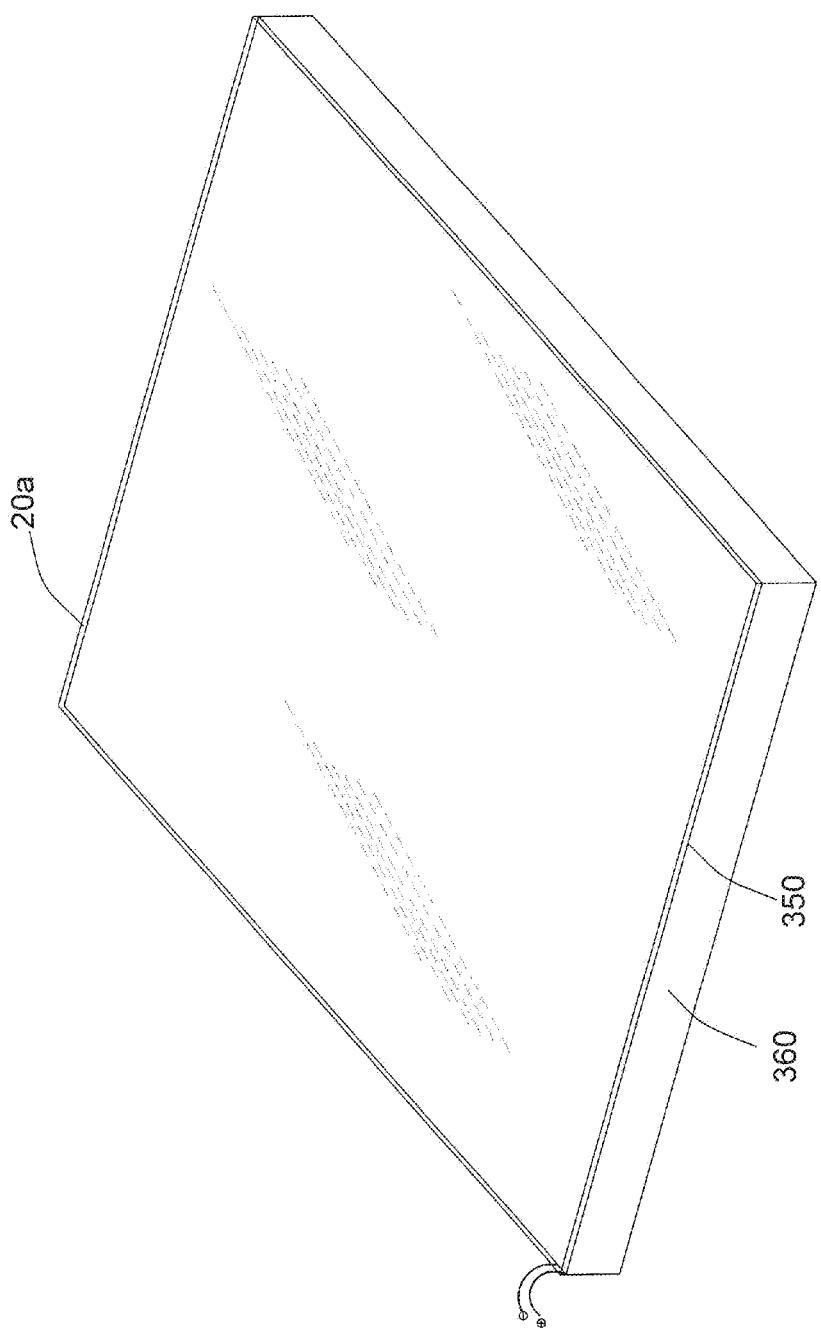
FIG. 9 illustrates a rectangular specialized cover plate/sheet for the housing according to an embodiment of the invention.
Figure 10:
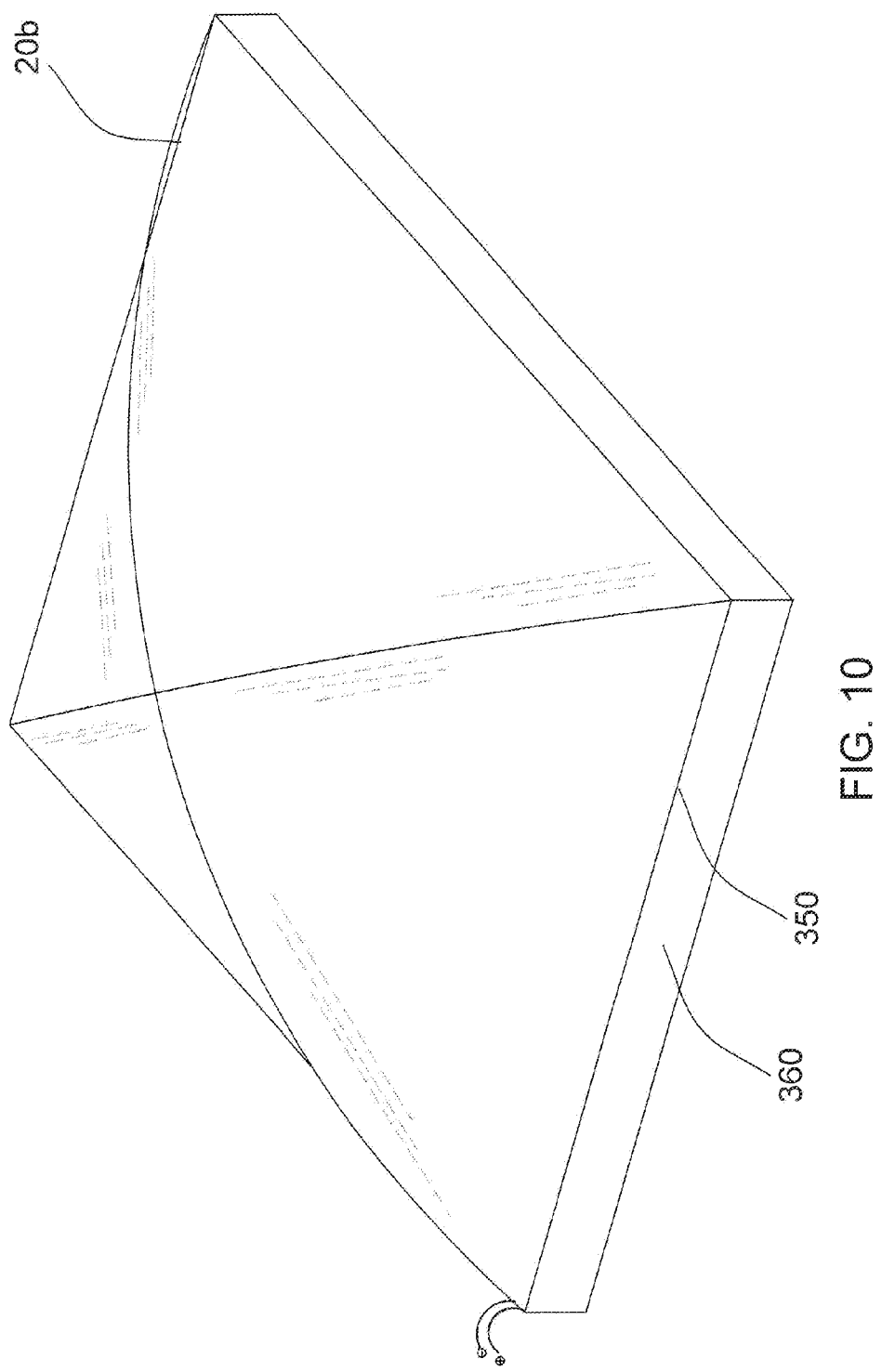
FIG. 10 illustrates a dome-shaped specialized cover plate/sheet for the housing according to an embodiment of the invention.

FIGS. 9 and 10 illustrate perspective views of the specialized cover plate/sheet 20. The specialized cover plate/sheet 20 can form a top wall for the housing of the PV system (as described earlier). FIG. 9 illustrates a rectangular specialized cover plate/sheet 20a (please label) for the housing while FIG. 10 illustrates a dome-shaped specialized cover plate/sheet 20b for the housing. The specialized cover plate/sheet 20 may be made of a thin sheet of a transparent material like polycarbonate, glass or the like so that the sheet does not substantially hinder any sunlight reaching the panels 10. Alternately a filter(s) (not shown) may also be used over the specialized cover plate/sheet 20 or on top of bridge plate 26a to receive desired frequency band from incident photon energy for reaching the panels to optimize the ECE while reducing side effects like heating. The specialized cover plate/sheet 20 can help to keep the inside panels cleaner, thereby increasing their life.

The specialized cover plate/sheet 20a, 20b may substantially envelope the PV system (shown earlier). The covers specialized cover plate/sheet 20a, 20b can be used over an individual panel or it can be grouped into a single integral cover for a series of panels. Other combinations are also within the scope of this invention. In an alternate embodiment, these specialized covers 20a, 20b (without the remaining components of the PV system of the embodiments of the invention) can be incorporated separately into new or existing solar panels designs.

The specialized covers 20a, 20b can be configured with infrared and ultraviolet filters and can have a coating on the undersurface 350 to prevent incident photon energy/light from escaping out. The undersurface 350 of the specialized cover plate/sheet 20a, 20b is designed for the light from inside the housing to reflect back onto the cells. By selecting different types of the various one-way reflecting systems known in the art, a desirable balance may be achieved between the light passing through into the housing and the light reflected back into the housing of the PV system. Alternately, an electrochromatic technique can be incorporated into the undersurface 350 in order to block the light penetration completely or partially, but intermittently so as to provide intermittent stimulation of the cells 40. The photon energy can be forced to reflect back. Furthermore, the inside surface of the sidewalls 360 may be coated with a suitable totally reflecting material, such that the light is totally reflected back into the housing. A vacuum may be created in the space between the covers 20a and 20b and the panels inside the housing to facilitate these multiple reflections without losing energy in the process.

Figure 12:
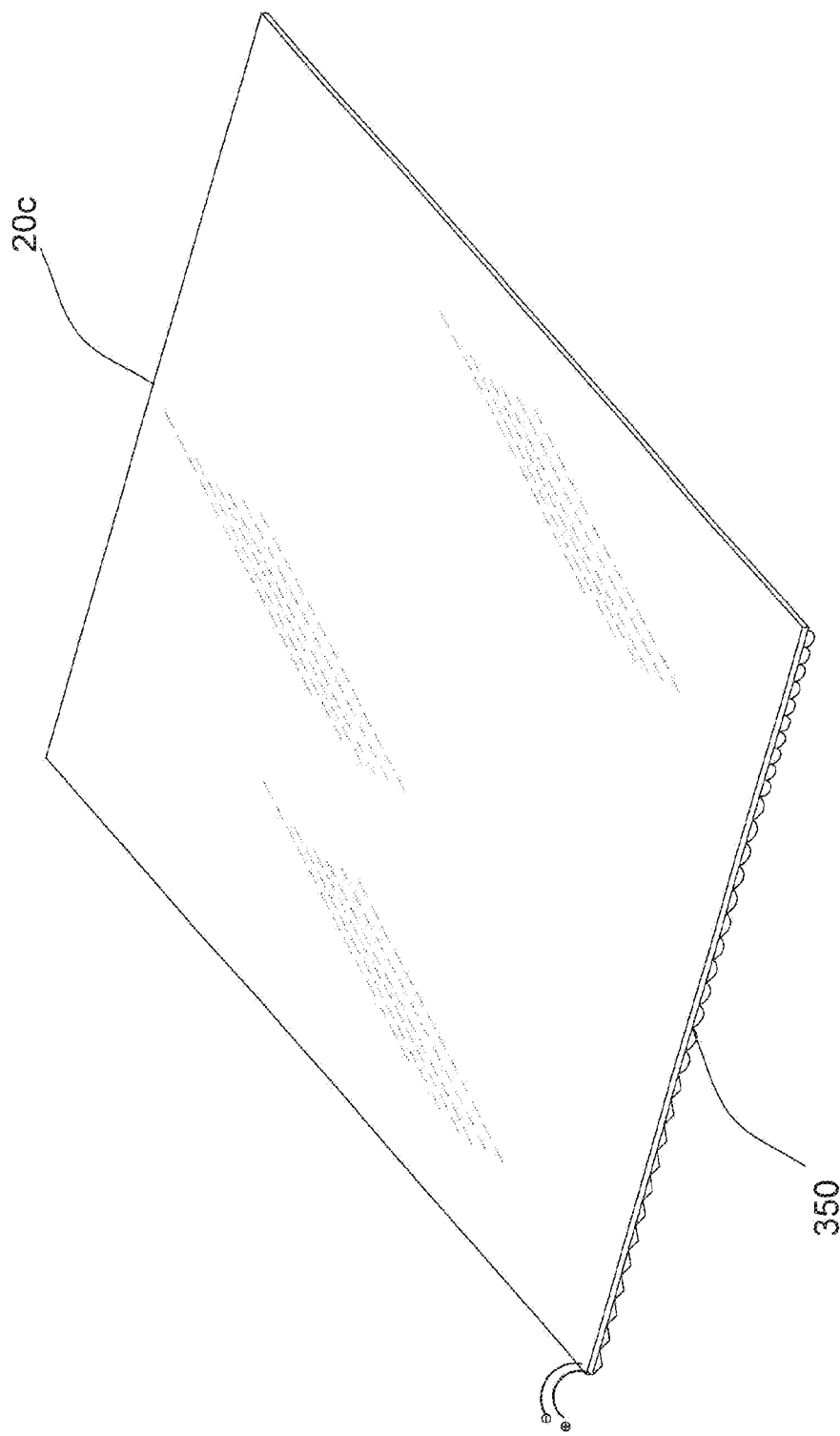
FIG. 12 illustrates a perspective view of a top layer of a specialized top cover plate/sheet to show an undersurface with different forms of the non-planar arrangements when desired, as against planar surface according to an embodiment of the invention.

The undersurface 350 of the specialized cover plate/sheet 20a, 20b shown in FIGS. 9 and 10, and shown separately in FIG. 12, and the inside of the sidewalls 360 may be planar and may also be non-planar. The undersurface 350 and the inside of the sidewalls 360 may be shaped as a half diamond, oval or spherical shape on cross section and can be arranged in any pattern. Other shapes are also within the scope of this invention. The surfaces 350 and 360 can also be textured or corrugated.

With these modifications on the undersurface 350 and to the inside sidewalls 360 and the reflection and scattering from the panels and the base panel (as shown, for example, in FIG. 5), light is forced to scatter back onto the panels inside the housing thereby facilitating multiple passes of the available light (as shown in FIG. 2). This will also help a rather uniform distribution of light onto panels irrespective of the angle in which the light enters the PV system, which thereby increases their efficiency.

The specialized cover plate/sheet 20a, 20b can be modified with infrared and ultraviolet filters, so that the heat production is minimized. This modification is similar to the ultraviolet filters incorporated into sunglasses and other similar devices. It is generally known that the visible light spectrum is capable of producing electricity, whereas infrared and ultraviolet wavelengths produce more heat than electricity. Through this combination of features the portion of the light that passes through the base panel (shown in FIG. 5, for example), without being converted to electricity, will be reflected back and forth inside the housing of the PV system. The PV system may be conveniently converted into hybrid photovoltaic thermal systems used to heat water or other fluids or materials by modifying specialized cover plate/sheet 20a, 20b appropriately with a suitable filter.

The wave filtration by the cover plates, internal reflection of the cover plates, intermittent opacification of the cover plates, the shape of the cover plates, the nature of the undersurface of the cover plates, the frequency of the opacification of the cover plates, the depth of the housing, the number of the panels in the multiple layers and the gaps between the panels, various techniques of maintaining optimal temperature in the housing and the technique of concentration of light to the PV system with mirrors are some of the variables that can be manipulated to achieve increased electricity production from the solar energy from a given surface area.

Figure 11:
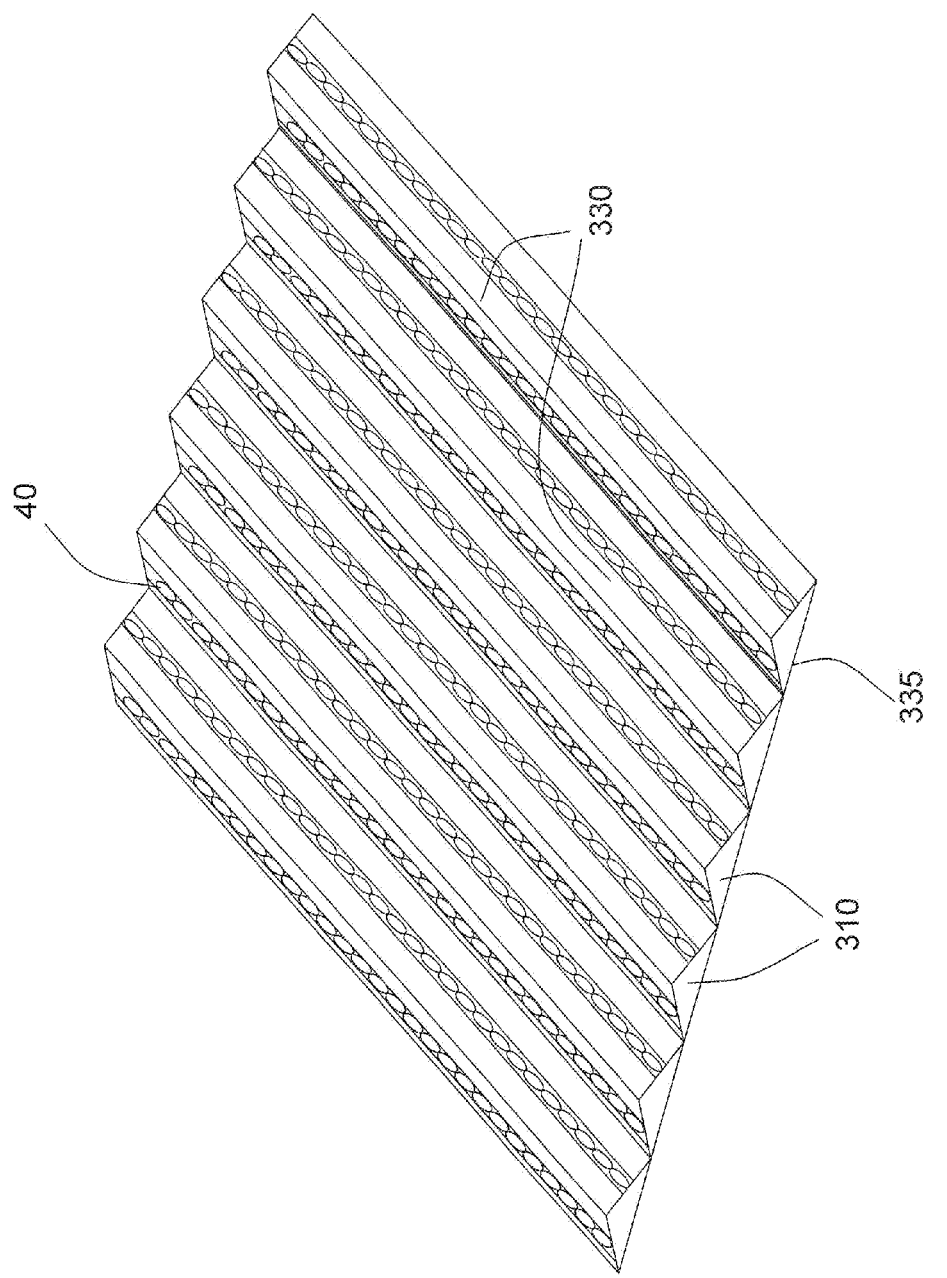
FIG. 11 illustrates a base panel of the housing with non-planar surface, and reflecting base with no gaps and no bridge plates according to an embodiment of the invention.

FIG. 11 represents a perspective view of a base panel 310, having cells/semi-conductors 40 arranged in a non-planar arrangement such that incident photon energy/light can reflect upwards and to the sides to facilitate scatter. The base panel 310 may not have gaps 12 or the bridge plates (shown earlier). The non-planar arrangement can be achieved by having the surface of the base panel 310 made up of, for example, half a diamond, oval or spherical shapes in cross section. The top surface 330 of the base panels 310 can be textured or corrugated. The base 335 of the panels 310 may be incorporated with a totally reflecting layer. The non-planar surface with or without the textured/corrugated surface along with the reflecting base 335 may facilitate light reflecting and scattering upwards and to the sides from the base panel 310.

FIG. 12 illustrates a perspective view of a top layer of a specialized top cover plate/sheet 20c. The specialized top cover plate/sheet 20c includes an undersurface 350 with different forms of the non-planar arrangements.

Figure 13:
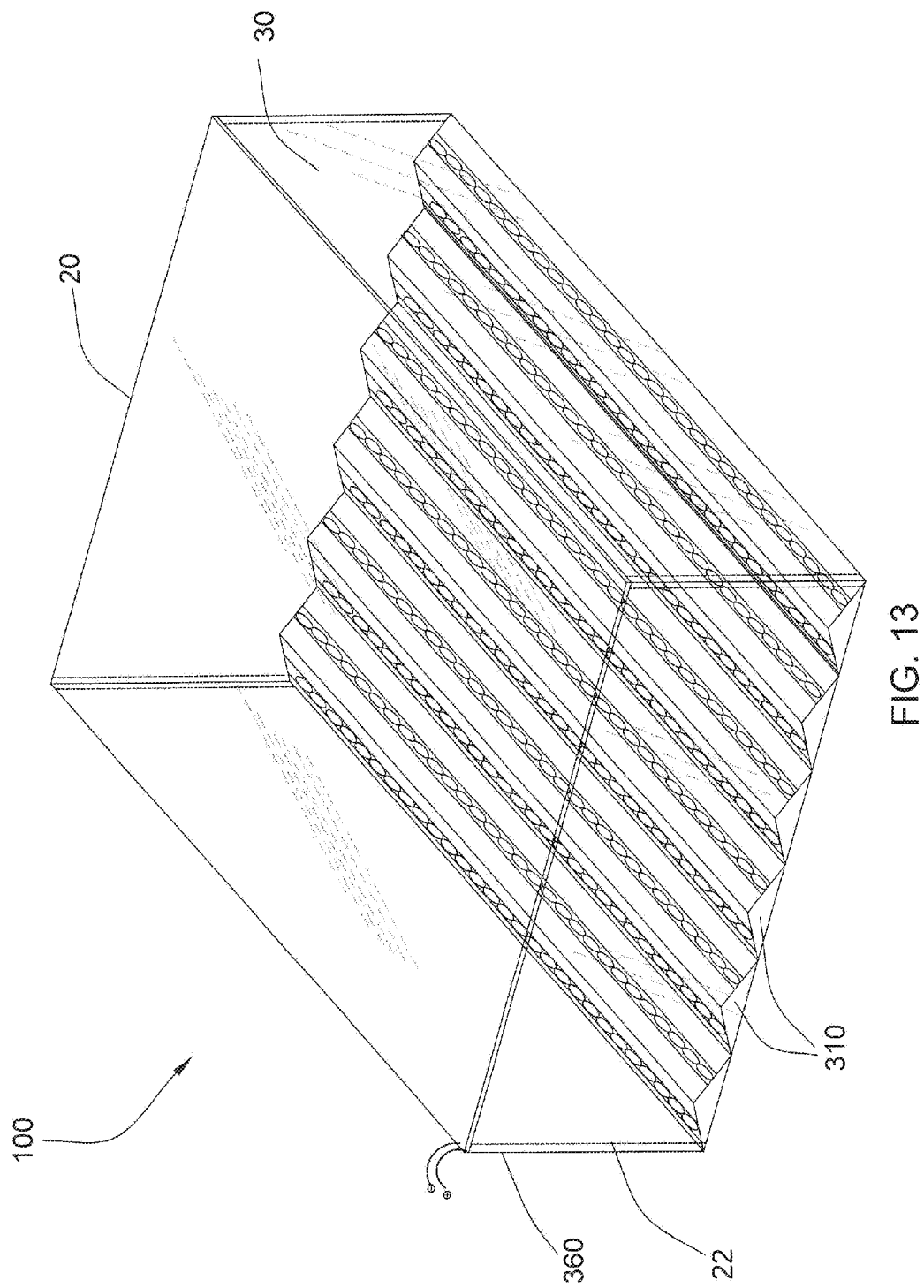
FIG. 13 illustrates a PV system with a specialized top cover plate/sheet and a base panel without any intervening panels, and the specialized top cover plate/sheet having a planar undersurface according to an embodiment of the invention.
Figure 14:
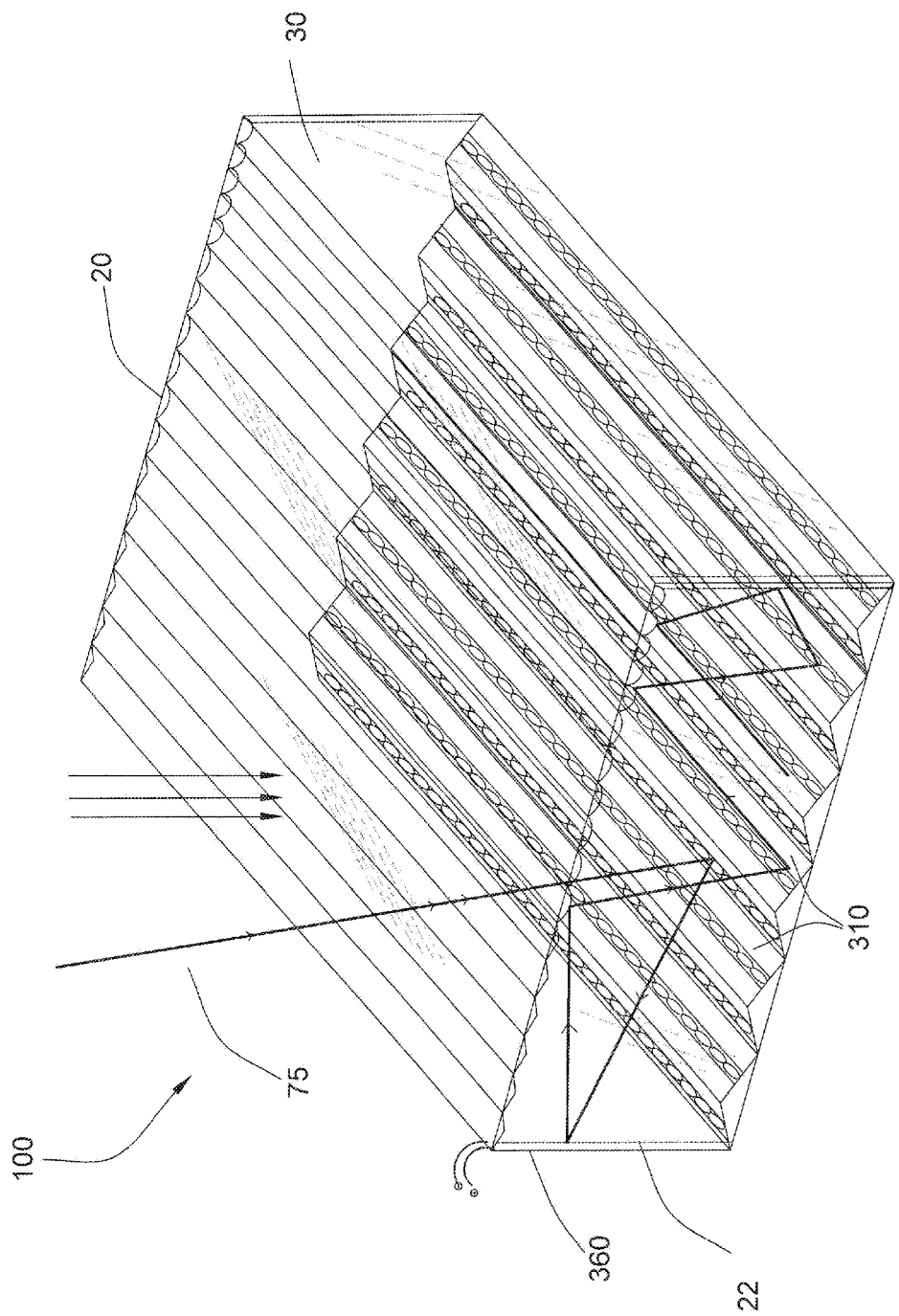
FIG. 14 illustrates a PV system with a specialized top cover plate/sheet and a base panel without any intervening panels, with the specialized top cover plate/sheet having a non-planar undersurface according to an embodiment of the invention.

FIGS. 13 and 14 illustrate yet another embodiment of a PV system 100. According to this embodiment, the housing 30 can have sidewalls 360 as shown. The housing 30 can include only a base panel 310. As shown in FIG. 13, the PV system 100 may have a specialized top cover plate/sheet 20 which has a flat under surface. The under surface or sidewalls 350 may be coated with a light reflecting material 22. As shown in FIG. 14, the specialized top cover plate/sheet 20 may have a non-planar under surface. The non-planar surface can be of any shape, for example, these may be V, U, hemispherical, or any other combination of shapes. Light rays 75 enter into the PV system where it can be reflected and bounced between the under surface of the top cover plate/sheet, the base panel 310 and the sidewalls 360.

Figure 15:
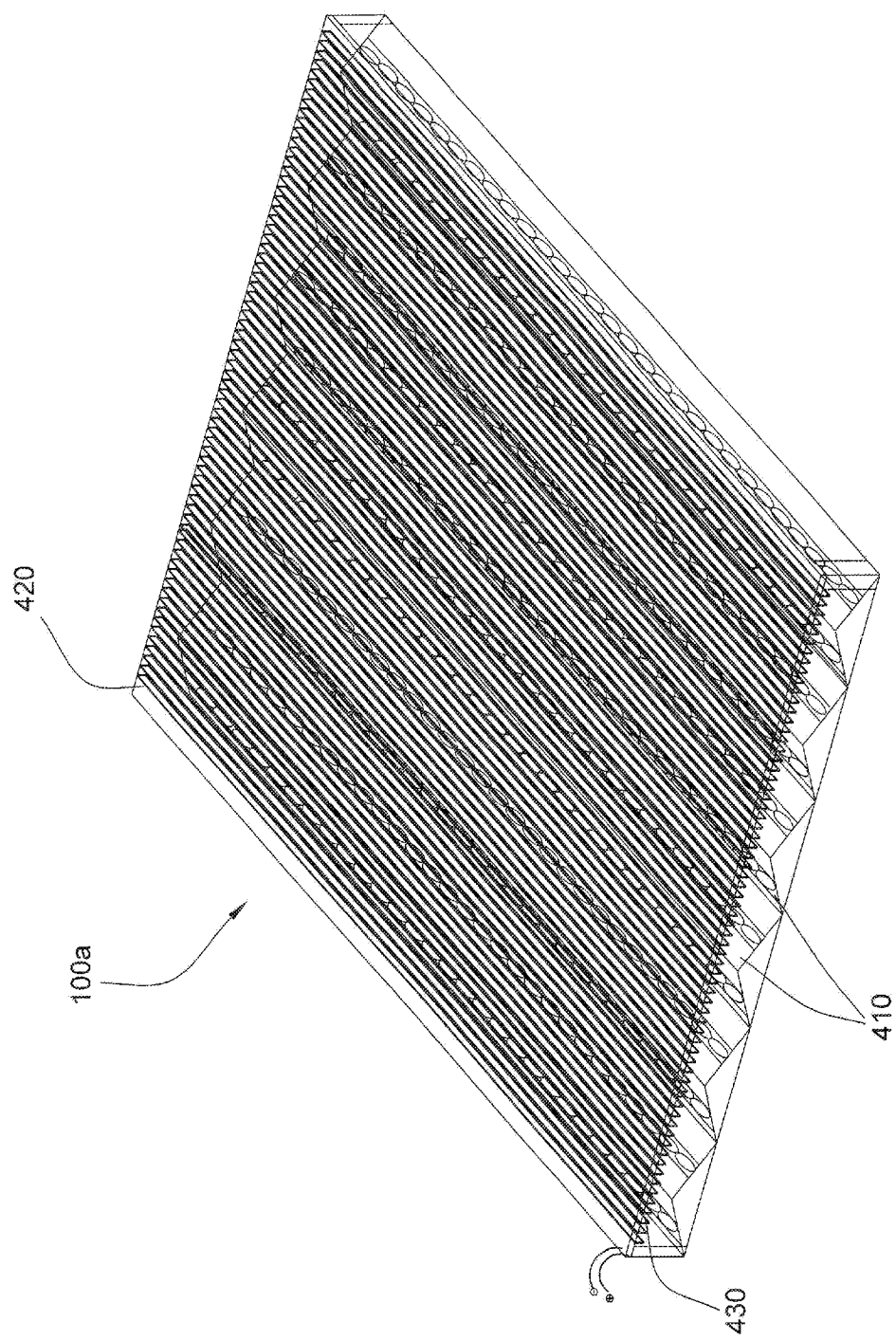
FIG. 15 illustrates a specialized top cover plate/sheet with hanging vertical mirrors on the undersurface according to an embodiment of the invention.
Figure 16:
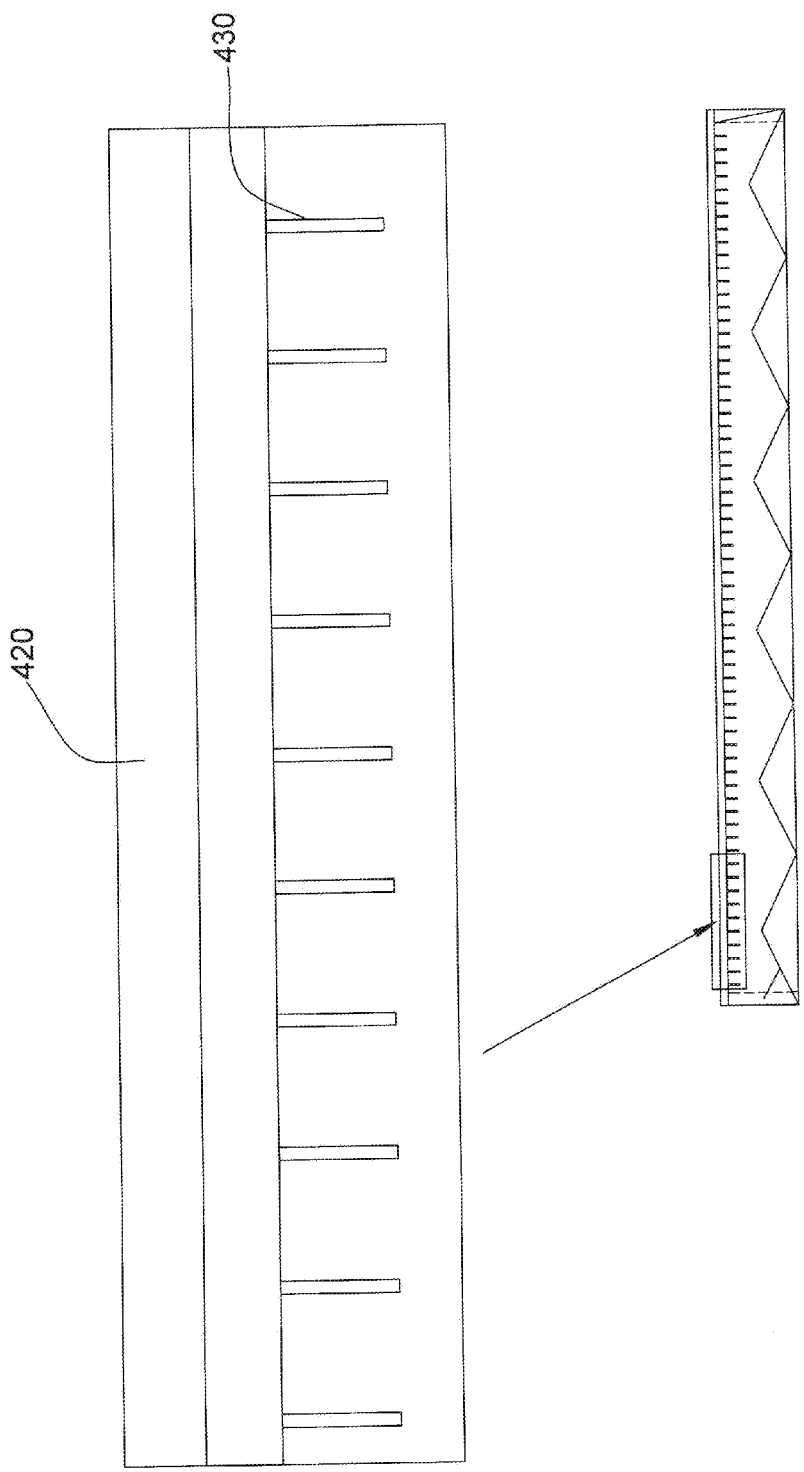
FIG. 16 illustrates an expanded portion of FIG. 15 according to an embodiment of the invention.

FIG. 15 illustrates an isometric view a PV system 100a. The PV system 100a includes a top cover plate/sheet 420 and a base panel 410. The top cover plat/sheet is analogous to the specialized top cover plate/sheet described earlier. Mirrors 430 may be affixed to the undersurface of the top cover plate/sheet 420. FIG. 16 shows an expanded view of the mirrors 430 attached to 420. The top cover plate/sheet 420 may be transparent. With reference to both FIGS. 15 and 16, mirrors 430 can be used to reflect photon energy back to the panel 410 and preventing the photon energy from escaping through the cover 420.

Figure 17:
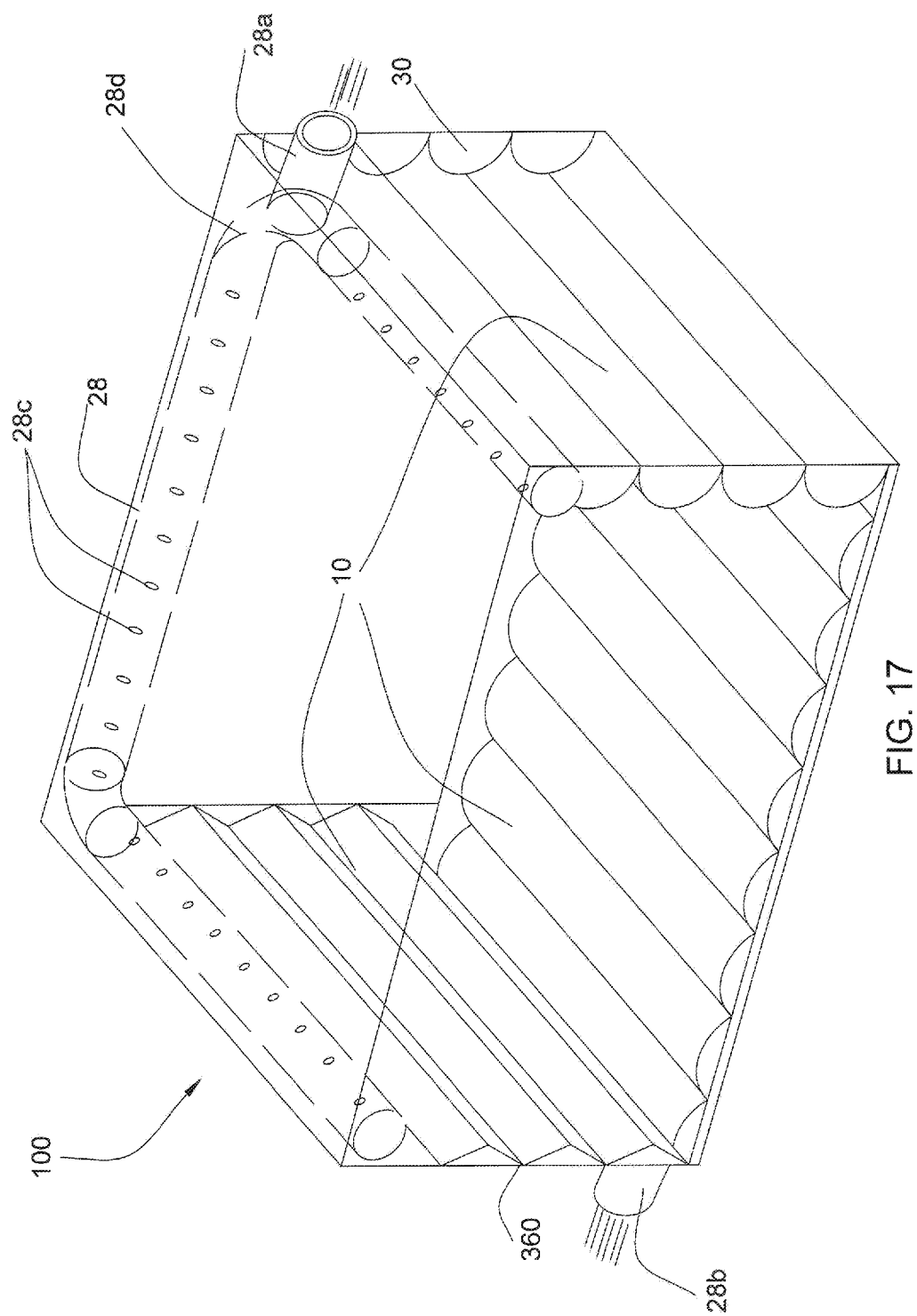
FIG. 17 illustrates a cooling apparatus with a sprinkler inside a PV system according to an embodiment of the invention.
Figure 18:
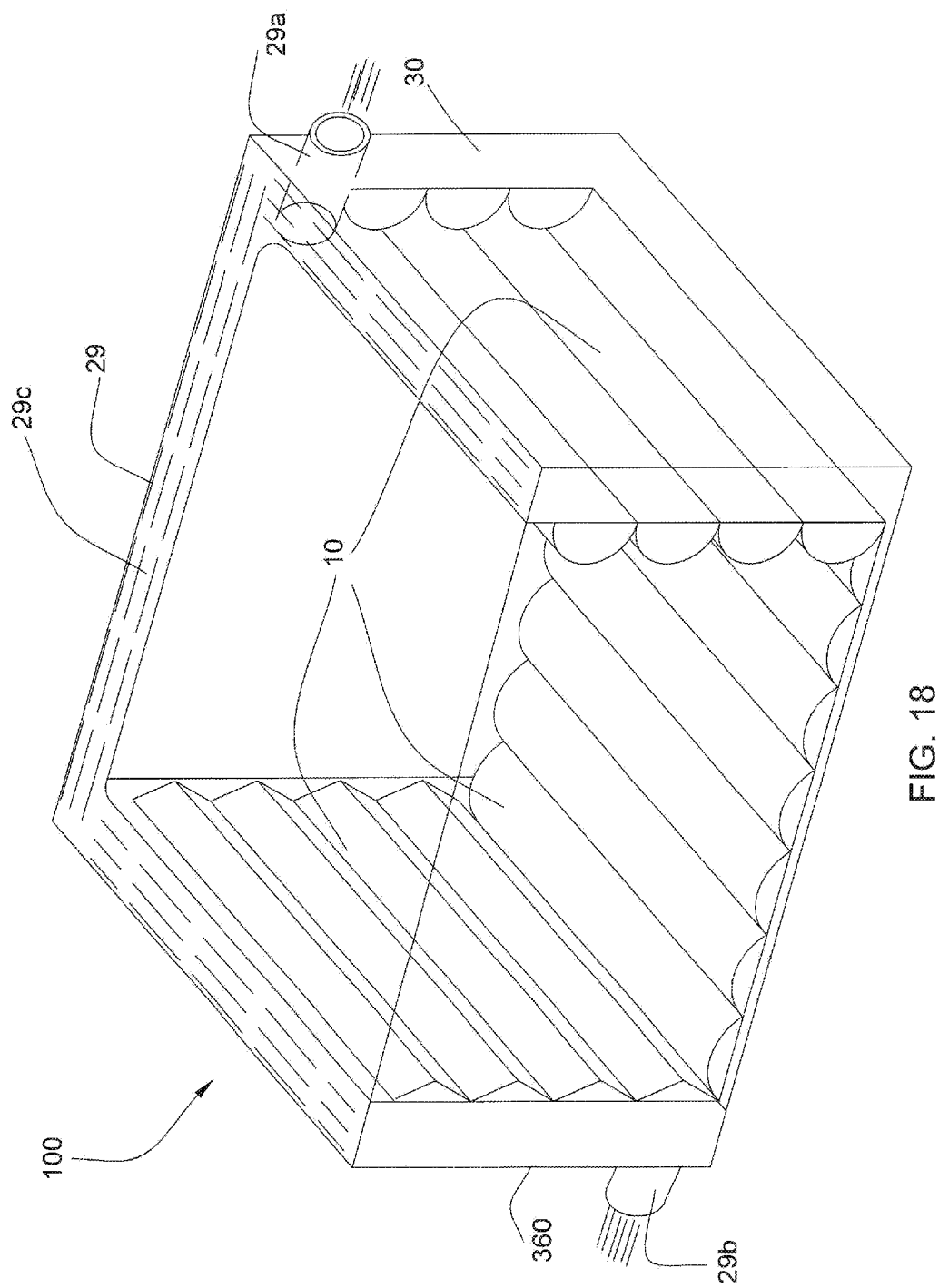
FIG. 18 illustrates the cooling apparatus within the walls of the housing of the PV system according to an embodiment of the invention.

In yet another embodiment of the PV system 100, as seen in FIGS. 17 and 18, panels 10 in different shapes can be laid inside one or more sidewalls 360 and/or the bottom of the housing 30. For simplicity, the rows of the panels 10 inside the housing 30 are not shown. The panels 10 on the sidewalls and/or the bottom of the housing 30 may not include gaps and may not be interconnected with bridge plates (as shown earlier).

FIG. 17 includes cooling apparatus 28. The cooling apparatus 28 may include piping 28d for circulation of a fluid (for example, water). The piping 28d may be positioned inside the housing 30. The cooling apparatus 28 has an inlet port 28a and an outlet port 28b. The piping 28d includes one or more apertures or openings 28c for sprinkling water or any suitable fluid onto the panels 10. The sprinkled fluid helps to maintain the panels 10 at an optimal temperature to provide better ECE. The sprinkled fluid also helps to keep the panels 10 cleaner. The fluid inside the piping 28d may be heated as it circulates through the PV system 100. The heated sprinkled fluid can be collected from the outlet port 28b and may also be utilized for any suitable purpose, such as for domestic use. Alternately, this embodiment can be made to optimize electricity production without any regard for the harvesting of heat energy. The cooling apparatus 28 is then utilized only to keep the temperature of the cells in the optimal range.

FIG. 18 illustrates another embodiment of the PV system 100. The PV system 100 includes cooling apparatus 29 to remove waste heat. As illustrated, cooling apparatus 29 includes a container 29c positioned outside the housing 30. The container 29c may be filled with water or any other suitable fluid. The cooling apparatus 29 has an inlet port 29a and an outlet port 29b. As the housing 30 gets heated, excess heat energy may be transferred from the walls of the housing 30 to the fluid inside the container 29c. The heated fluid from the outlet port 29b can be useful such as for domestic applications. Dissipating out the heat from the walls of the housing 30 may cool the housing 30, thereby cooling the panels 10 for a more optimized performance. Referring to both FIGS. 18 and 19, in the absence of this cooling apparatus 28, 29, residual heat can be pumped out of the PV system 100 by fans (as in the various electronic devices).

Figure 19:
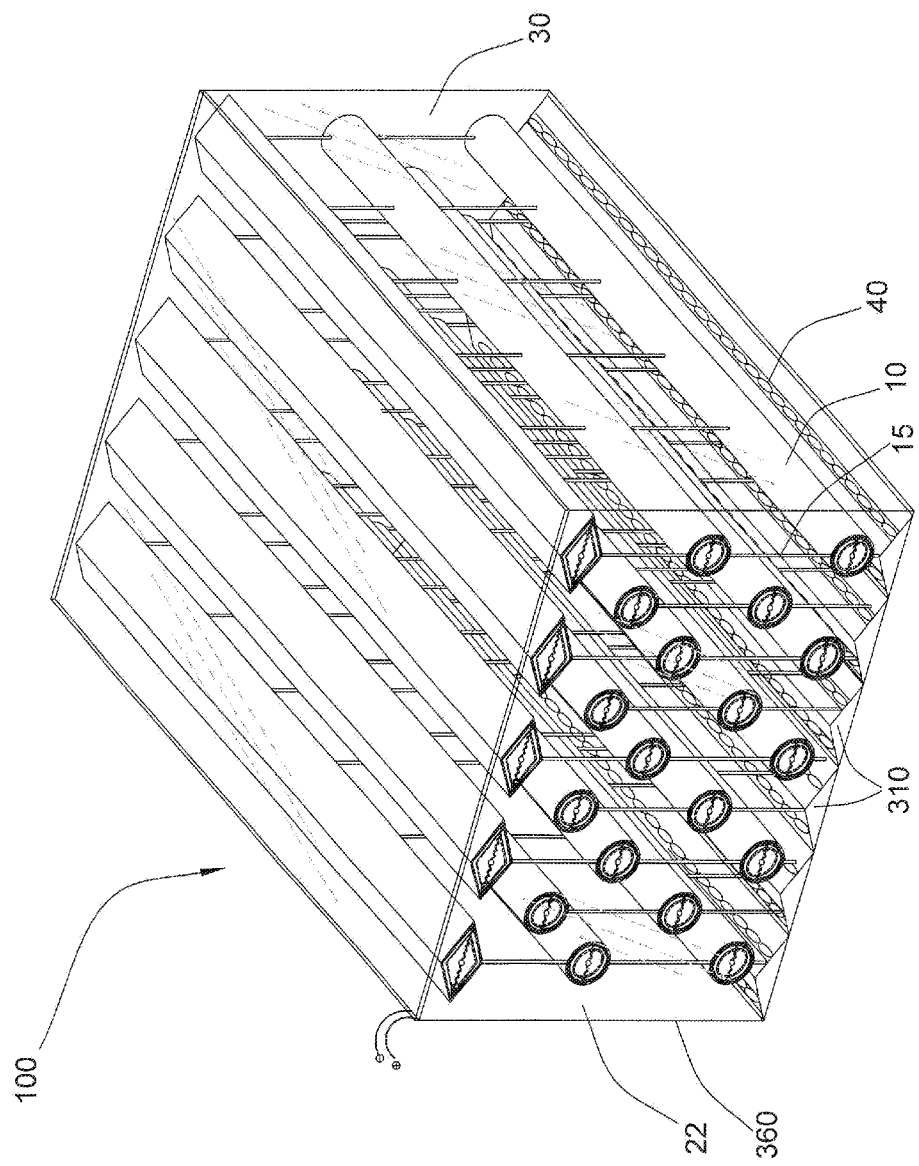
FIG. 19 illustrates another embodiment of the PV system comprising circular elongated panels supported with rods.
Figure 20:
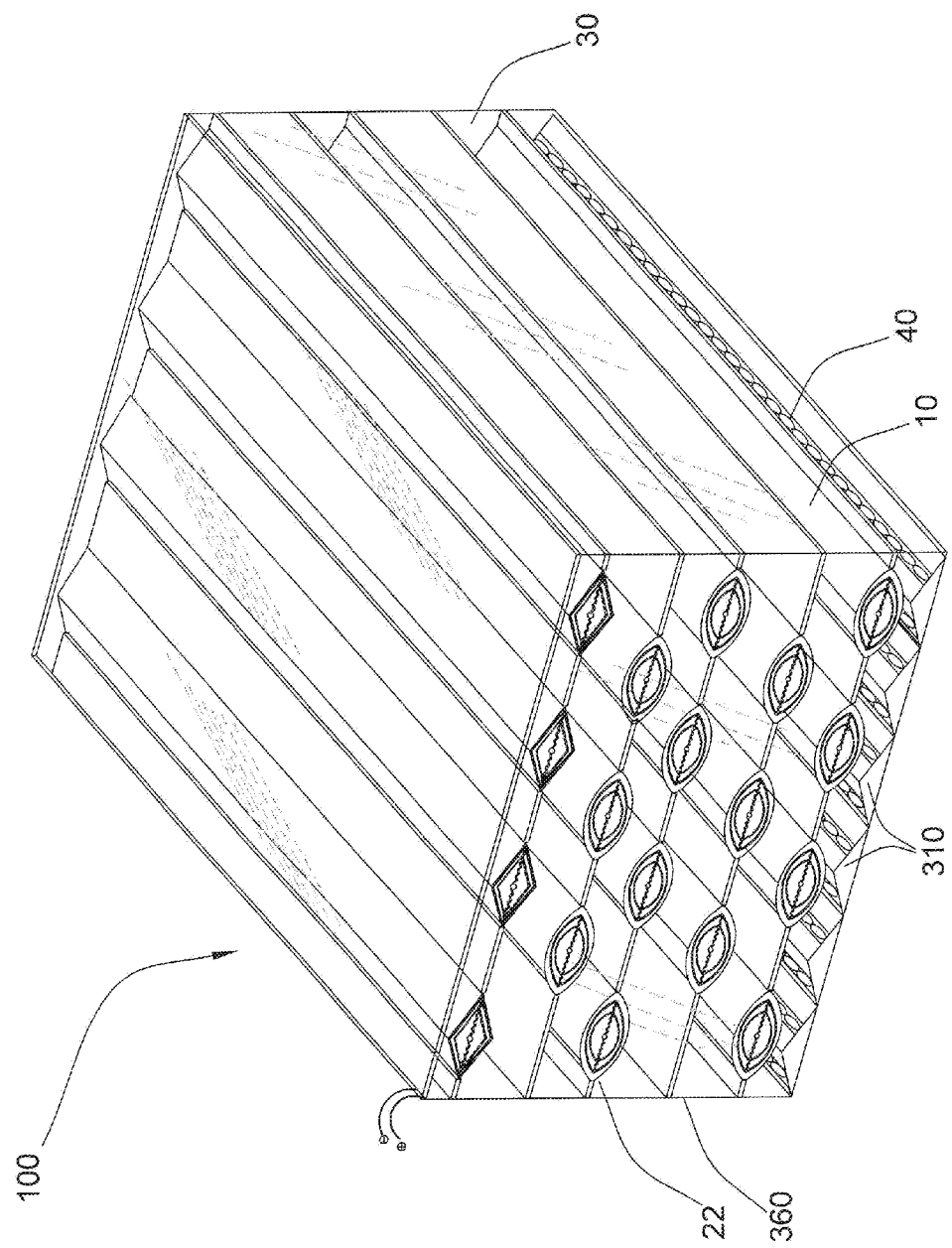
FIG. 20 illustrates another embodiment of the PV system with oval elongated panels with bridge plates.

FIGS. 19 and 20 show embodiments of the PV system 100. The PV system 100 includes internal panels 10 of circular and oval shapes respectively. The top panels may 10 may be diamond-shaped. The panels 10 may include cells 40 (and, as shown in FIG. 19, the panels 10 may be supported on posts 15). The sidewalls 360 of the housing 30 may be provided with reflecting surfaces 22 for further enhancing the incident photon energy on the cells 40. The reflecting surfaces 22 may be used with just the base panels 310 in the housing 30, as shown in FIGS. 13 and 14.

FIGS. 26 and 27 illustrate a view of the PV system 100 installed in a residential house or building 110 along with a mirror assembly 50, in a front and side elevation view, respectively, for enhancing the incident photon energy (not shown) on the panels 10. A separate room in the building 110 can be dedicated for the PV system 100. The electrical needs of the building 110 can be accommodated by the PV system 100. The PV system 100 can also be mounted above a garage 110a or placed adjacent to the building 110 as a freestanding unit.

Figure 28:
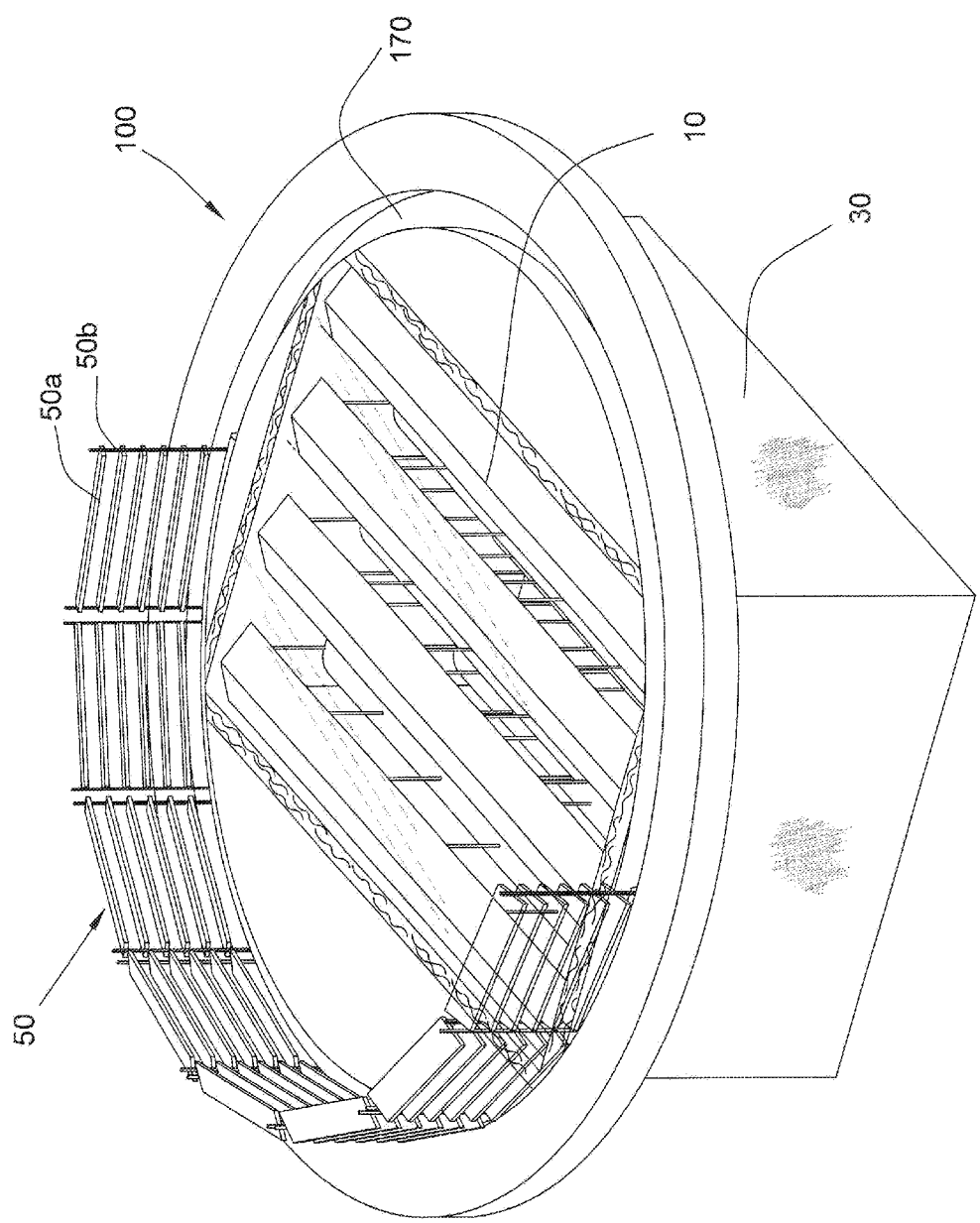
FIG. 28 illustrates a perspective view of a PV system with a mirror assembly installed as part of a building to meet its electrical needs according to an embodiment of the invention.

FIG. 28 illustrates an embodiment of the PV system 100 wherein the mirror assembly 50 (shown in FIGS. 26 and 27) is advantageously in an arcuate shape for providing focused photon energy to the PV system 100. The mirror assembly 50 can include a plurality of individual mirrors 50a arranged on one or more vertical supporting stands 50b in order to reflect the photon energy onto the panels 10 placed inside housing 30. In use, the mirror assembly 50 may be provided with a railing assembly 170. The vertical supporting stands 50b can be configured to rotate on their own axis or tilt and move in a suitable manner so as to maximally redirect the photon energy on the panels 10 (and, thereby activate the cells therein), depending upon the height and position of the sun in the sky. The mirror assembly 50 can be configured to be easily assembled and dissembled using techniques known in the art. For example, mirror assembly 50 can be conveniently folded down to protect it under bad weather conditions.

The railing assembly 170 and/or the angles of the mirror assembly 50 can include sensors (not shown) to automatically track the direction of the sun and to automatically adjust their position relative to the housing 30 such that the PV system 100 is always facing the sun for further enhancing the incident photon energy. Alternately, by making the mirror assembly 50 face the East direction in the morning and face the West direction in the evening, increased light collection and focusing is facilitated. Depending on whether the sun in North or South of the equator, the mirror assembly 50 can be configured to move 360 degrees every 24 hours in a clockwise or anti-clockwise direction respectively in southern hemisphere or vice versa in the northern hemisphere. This allows the PV system 100 to be more efficient in the collection of solar energy (which is then converted into electrical energy), without the need for sensors.

Figure 30:
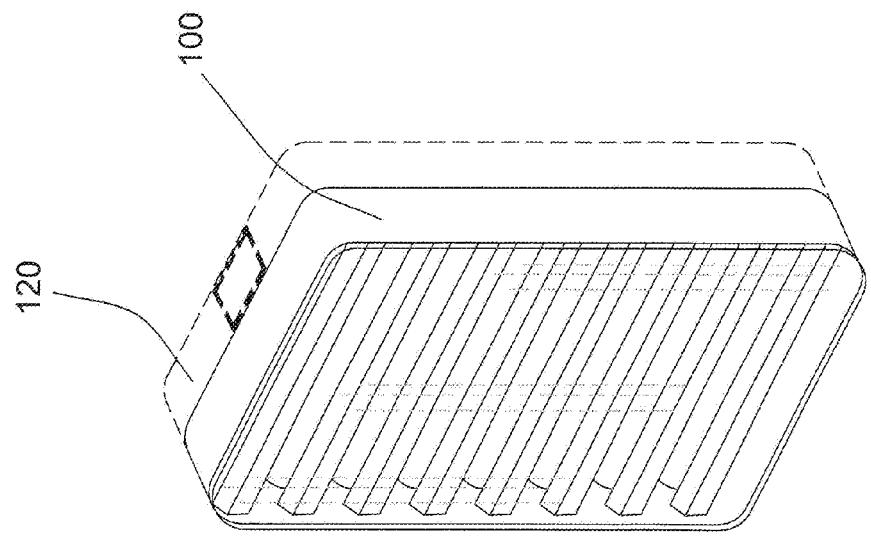
FIGS. 29 and 30 illustrate front and back perspective views of a mobile phone using the PV system according to an embodiment of the invention.
Figure 29:
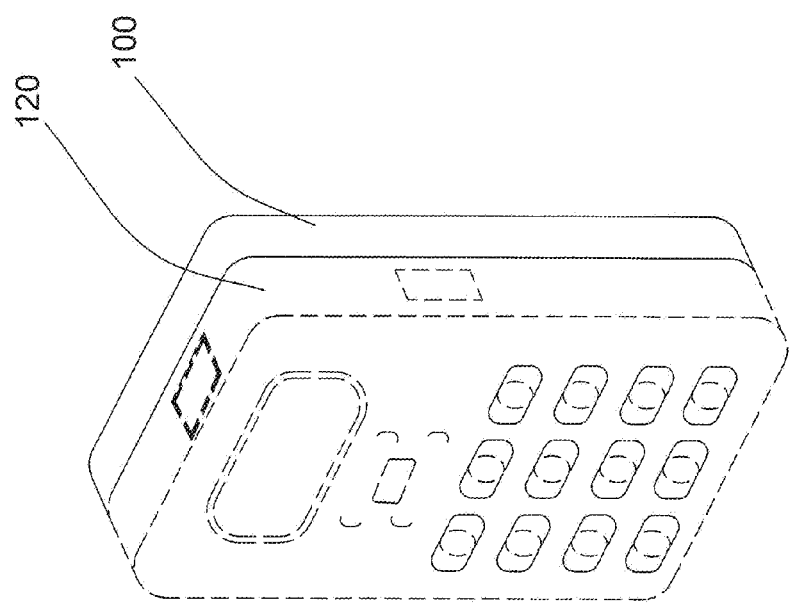

FIGS. 29 and 30 illustrate front and back perspective views of a mobile phone using the PV system according to an embodiment of the invention where the PV system 100 is installed at the rear for providing electrical power for operation of the phone 120. However, the PV system 100 may be installed on the sides or the top or bottom of the mobile phone 120. One or more of the embodiments of the PV system 100 described earlier may be implemented here. The PV system 100 may eliminate the need for a conventional mobile phone battery. Alternately, the PV system 100 can be an independent unit and can be used as a solar battery charger for the mobile phone, laptop and other devices.

Figure 31:
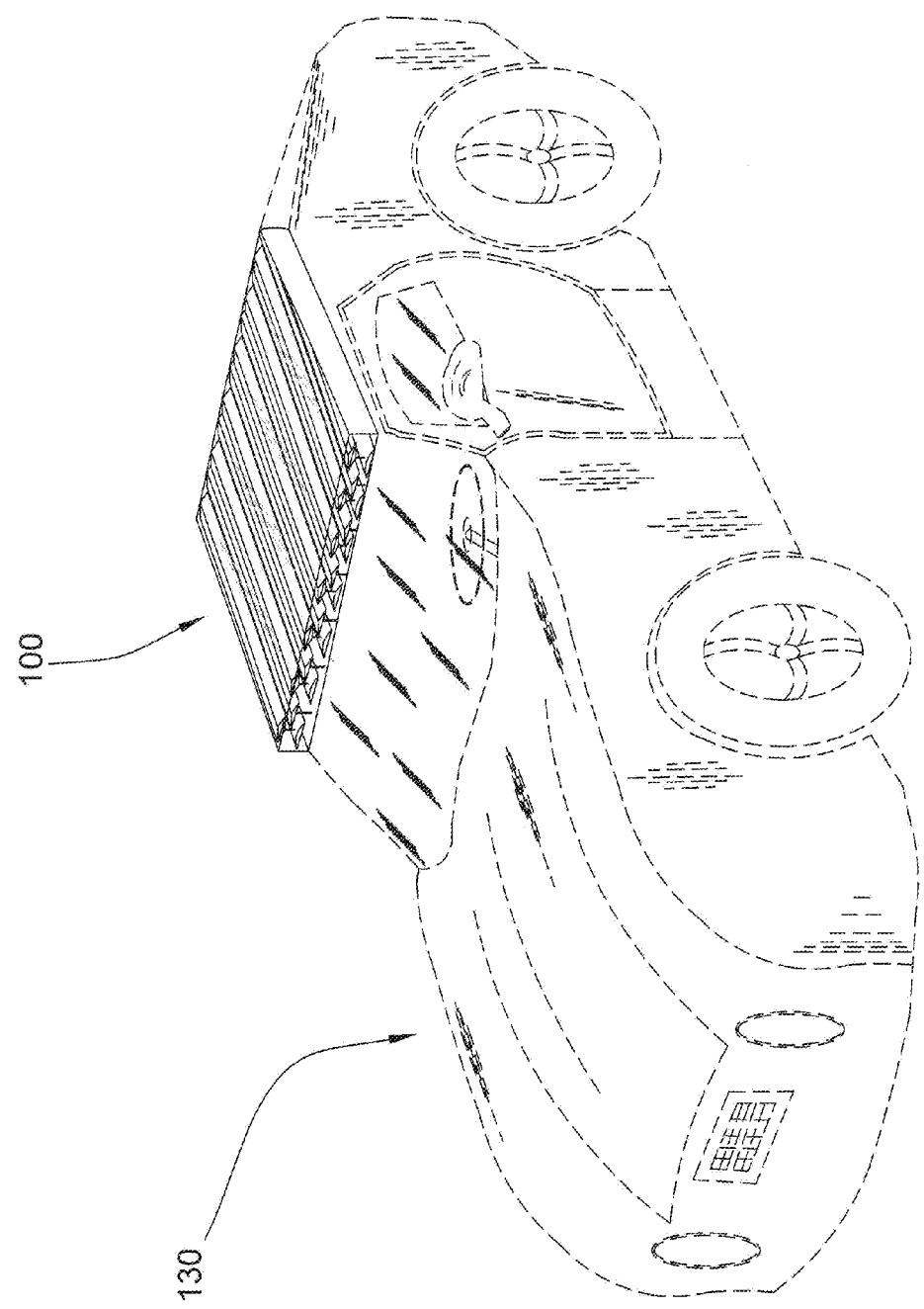
FIG. 31 illustrates a perspective view of a motor vehicle using the PV system according to an embodiment of the invention.

FIG. 31 illustrates a perspective view of a motor vehicle using the PV system 130 to use the generated electrical power for operations in the vehicle 130. One or more of the embodiments of the PV system 100 described earlier may be implemented here. Alternately, a larger unit may be installed on the ground at desirable locations to recharge electric cars. Yet another option is to have large trucks as mobile units equipped with the PV system 130 to be made available to recharge electric cars on the highways and roads.

According to an embodiment, a method for optimizing the harvesting of solar energy includes: providing a photovoltaic system for receiving the solar energy, the photovoltaic system comprising: a housing; and at least one layer of a panel arranged in the housing. The recycling of incident light in the housing is enabled. The light can be intermittently or continuously recycled. The amount of reflections can be modified by the percentage of reflection, non-planar surface types of the panels, the amount of reflecting areas and other methods to optimize the desired amount of reflection to maximize electricity generation.

The photovoltaic system can include a specialized top cover plate/sheet for the housing. The specialized top cover plate/sheet may be covered or coated with an ultraviolet filter and/or an infra-red filter. The specialized top cover plate/sheet can be configured to filter out specific light wave lengths and to reflect light inside the housing back on to the panels. A reflective surface may be provided underneath the specialized top cover plate/sheet. The photovoltaic system can further configured to at least intermittently block off light from partially or completely entering the housing. For example, the specialized top cover plate/sheet can be configured to intermittently block off light partially or completely entering the housing, in order to stimulate the solar cells intermittently.

At least one or more sidewalls of the housing may be provided with a substantially totally reflecting surface. The housing can be vacuum sealed and vacuum insulated. The housing may have reflecting sidewalls and bottom with a unique panel geometry and arrangement to facilitate variable but optimal reflection and recycling of light inside the housing. The housing includes special panels having solar cells on the top and the bottom surfaces overlying a reflecting base at the top and the bottom. The housing can include specialized panels arranged with solar cells and reflecting surfaces on the top and on the bottom, arranged in a diamond shape, oval shape, circular or any such combination on cross section. The housing may be provided with a top layer of panels in elongated sheets or in the form of pyramids, hemispheres, etc.

An optimal temperature is maintained inside the housing by circulation of fluid inside or outside the housing.

In another embodiment, the photovoltaic system may include at least two or more panels. The panels may be arranged such that there is a predetermined spacing between the panels. The panels may include one or more photovoltaic cells (semi-conductors). One or more of the panels is a non-planar panel. The panels can be textured and corrugated. The panels can include cells on its top and the bottom surfaces overlying a reflecting base at the top and the bottom. The panels can be diamond shape, oval shape, circular or any such combination in cross section.

In another embodiment, the photovoltaic system may include a plurality of layers of panels, wherein each layer of panels comprises two or more panels. Each of the panels in a second and in a subsequent layer of panels is positioned substantially beneath the spacing between each of the panels in a first or a previous layer of panels such that the recycling of light is facilitated.

The spacing between the panels in the second and subsequent layer of panels is arranged substantially underneath each panel in the first or previous layers of panels. Each of the panels in the first and second (or subsequent) layer of panels comprises a shape configured to accomplish a near total or total internal reflection for the recycling of light. The layers of panels are arranged at a suitable non-planar surface angulation such that a substantial amount of the light is trapped in the housing, and recycled. Light may be allowed to fall intermittently or continuously on the panels.

Upon the condition that the housing is devoid of a specialized top cover plate/sheet, the panels in a first/top panel layer may be interconnected by covering the spacing between the panels with one or more bridge sheets. The top layer of panels may be elongated sheets or in the form of pyramids, hemispheres, etc. The bridge sheets in the first panel layer may be coated or covered with an ultraviolet filter and/or an infra-red filter. A reflective surface may be provided underneath the bridge sheets. The bridge sheet of the top panel may have all or most of the characteristics of the specialized top cover plate/sheet.

Production of electrical energy may be optimized by providing a photovoltaic system according to one or more embodiments, wherein the photovoltaic system includes a reflective surface on one or more of the following: underneath the specialized top cover plate/sheet or top layer bridge sheet, on top of the panels, on an undersurface of the panels, on one or more sidewalls of the housing and on an inside surface of the bottom of the housing.

According to an embodiment, an intermittent stimulation of the photovoltaic cells may be facilitated by intermittent graded opacification of at least one of the specialized top cover plate/sheet for the housing or the bridge sheet at variable frequencies.

According to an embodiment, a mirror assembly is provided. The mirror assembly can be configured to move over a railroad like arrangement around the photovoltaic system to redirect the light onto the housing. The mirror assembly comprises a plurality of mirrors and one or more mirror stands for the mirrors. The mirror stands are arranged in a series to form a semi-circle or a portion of a semi-circle. According to an embodiment, a photovoltaic system is disclosed herein. The photovoltaic system includes: a housing; and one or more layers of at least two or more panels arranged in the regular or vacuum sealed housing, wherein each of the panels is arranged with a predetermined spacing between the panels, and wherein a predetermined spacing is provided between each of the two or more panel layers to facilitate near total or total internal reflection, and recycling of light in the housing. The photovoltaic system can be positioned on an adjustable rack. The adjustable rack can be configured for use on a vehicle. According to another embodiment, the photovoltaic system is configured to be used as a grounded or mobile unit to charge electric cars.

According to another embodiment, the photovoltaic system is configured to be used as a charging device for mobile phones, laptops and other similar devices. The photovoltaic system can be configured for use on a mobile phone to substantially eliminate the need for a conventional rechargeable battery.

According to another embodiment, the photovoltaic system can be located on a building to provide the electrical needs of the building.

Energy production may be optimized by arranging a reflecting surface on one or more of the following: the undersurface of each panel on the first layer of panels; a top and undersurface of each panel on a subsequent layer of panels, and the top panel if the special cover is used; and an inside surface of the housing.

According to another embodiment, the photovoltaic system can optimize cell stimulation by adjusting the gap between the panels, space between the panel layers and selecting appropriate non-planar surface angulation of the panels to facilitate total or near total reflection and recycling of light in the housing and complement the other variables.

Alternately, the PV system 100, according to one or more embodiments described herein, may be implemented as fixed ground units or as mobile units to charge present day electric or hybrid cars. Thus, the PV system 100 can be a suitable replacement for a battery or charging device.

According to an embodiment, the electrical energy generated by the PV system, according to the embodiments described herein, can be collected, stored (for example, in a battery) and distributed through specialized methods already in use.

According to one or more embodiments, if it is predetermined that the cells cannot handle the electricity generated due to the enormous amount of bouncing light rays within the PV system, an appropriate arrangement can be incorporated into the PV system to reduce the percentage of reflection inside the housing. For example, the reflection can be reduced by limiting the reflection to one limb of a panel (such as, on one side of the V-shaped panel) or some such similar arrangement.

According to one or more embodiments, there will be more energy output per unit area of the PV system. This may facilitate the widespread use and acceptance of solar technology for consumer, commercial, defense, scientific and industrial purposes.

It should be understood that, as used herein, "first," "second," "third," etc., and "top" and "bottom" are arbitrarily assigned and are merely intended to differentiate between two or more panels, their positions, etc., as the case may be, and does not indicate any particular orientation or sequence. Furthermore, it is to be understood that the mere use of the term "first" does not require that there be any "second," and the mere use of the term "second" does not require that there be any "third," etc.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular illustrative embodiments disclosed above may be altered or modified and all such variations are considered within the scope and spirit of the present invention. While apparatus and methods are described in terms of "comprising," "containing," or "including" various components or steps, the apparatus and methods also can "consist essentially of" or "consist of" the various components and steps. In particular, every range of values (of the form, "from about a to about b," or, equivalently, "from approximately a to b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent(s) or other documents that may be incorporated herein by reference, the definitions that are consistent with this specification should be adopted. From the foregoing description it will be understood by those skilled in the art that many variations or modifications in details of design, construction and operation may be made without departing from the present invention as defined in the claims.

The invention claimed is:

1. A method for optimizing harvesting of solar energy comprising:
    providing a photovoltaic system for receiving the solar energy, the photovoltaic system comprising:
    a housing; and
    a plurality of panels;
    arranging the panels in at least an upper and a lower panel layer, wherein the upper panel layer comprises at least a first, a second, and a third panel without any intervening panels between the first and the second panel, and wherein the first and the second panels of the upper panel layer are separated from each other by a predetermined gap and the lower panel layer comprises a third panel;
    interconnecting between the first and second panels and between the second and third panels of the first panel layer with a plurality of transparent bridge plates, wherein the bridge plates comprise glass plates or polycarbonate plates; and
    positioning the third panel of the lower panel layer substantially beneath the predetermined gap and completely between the first and second panels of the upper panel layer to allow incident light to reach the lower panel layer for facilitating recycling of the light in the housing, wherein the light is intermittently or continuously recycled.

2. The method according to claim 1, wherein the photovoltaic system comprises a top cover plate/sheet for the housing.

3. The method according to claim 1, wherein the housing comprises one or more sidewalls comprising a substantially totally reflecting surface.

4. The method according to claim 1, wherein the plurality of panels comprise a non-planar surface angulation to facilitate varying predetermined amount of light reflection.

5. The method according to claim 4, wherein the plurality of panels are textured and corrugated.

6. The method according to claim 1, further comprising arranging the lower panel layer at a predetermined distance from the upper panel layer.

7. The method according to claim 1, wherein the housing is vacuum sealed and vacuum insulated.

8. The method according to claim 1, further comprising allowing the light to fall intermittently on the plurality of panels.

9. The method according to claim 1, further comprising maintaining an optimal temperature inside the housing, by circulation of fluid inside or outside the housing.

10. The method according to claim 2, further comprising covering the top cover plate/sheet with an ultraviolet filter and/or an infra-red filter.

11. The method according to claim 1, wherein the transparent bridge plates are coated with an ultraviolet filter and/or an infra-red filter to allow only optimal bands of light to enter into the housing.

12. The method according to claim 1, wherein each of the plurality of panels comprises one or more photovoltaic cells.

13. The method according to claim 12, further comprising facilitating an intermittent stimulation of the one or more photovoltaic cells by intermittent graded opacification of the bridge plates at variable frequencies.

14. The method according to claim 1, further comprising providing a reflective surface underneath the transparent bridge plates.

15. The method according to claim 1, further comprising providing a mirror assembly, the mirror assembly configured to move over a railroad like arrangement around the photovoltaic system to redirect the light onto the housing.

16. The method according to claim 15, wherein the mirror assembly comprises a plurality of mirrors and one or more mirror stands for the mirrors, wherein the mirror stands are arranged in a series to form a semi-circle or a portion of a semi-circle.

17. The method according to claim 12, further comprising:
    substantially trapping the light within the housing, wherein the light is recycled within the housing in multiple planes and multiple directions causing the trapped light to be potentially reflected multiple times to cause photons to repeatedly stimulate the one or more photovoltaic cells.

18. The method according to claim 1, further comprising providing a reflective surface on top of the plurality of panels, on an undersurface of the plurality of panels and on an inside surface of the bottom of the housing.

19. The method according to claim 1, wherein the first panel layer is located on a top of the housing such that the transparent bridge plates in the first panel layer form a cover for the housing.

20. The method according to claim 19, further comprising applying an ultraviolet (UV) or infrared (IR) filter or coating on an outer surface of the transparent bridge plates of the first panel layer such that only optimal bands of light can enter the housing.

\* \* \* \* \*